(12) United States Patent
Lee et al.

(10) Patent No.: US 11,581,392 B2
(45) Date of Patent: Feb. 14, 2023

(54) DISPLAY DEVICE

(71) Applicant: Samsung Display Co., LTD., Yongin-si (KR)

(72) Inventors: Jung Wook Lee, Hwaseong-si (KR); Yeong Ho Kim, Incheon (KR); Yong Jae Park, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/350,628

(22) Filed: Jun. 17, 2021

(65) Prior Publication Data

US 2022/0013619 A1    Jan. 13, 2022

(30) Foreign Application Priority Data

Jul. 9, 2020  (KR) .................. 10-2020-0084594

(51) Int. Cl.
| | | |
|---|---|---|
| *H01L 27/32* | (2006.01) | |
| *G09G 3/3233* | (2016.01) | |
| *H01L 51/56* | (2006.01) | |
| *G06F 3/044* | (2006.01) | |
| *H04N 5/225* | (2006.01) | |

(52) U.S. Cl.
CPC ....... *H01L 27/3276* (2013.01); *G09G 3/3233* (2013.01); *H01L 51/56* (2013.01); *G06F 3/044* (2013.01); *G09G 2300/0809* (2013.01); *G09G 2330/10* (2013.01); *H01L 2251/568* (2013.01); *H04N 5/2257* (2013.01)

(58) Field of Classification Search
CPC ......... G09G 3/3233; G09G 2300/0809; G09G 2330/10; H01L 27/326; H01L 27/3262; H01L 27/3272; H01L 27/3276; H01L 51/56; H01L 2251/568; G06F 3/044; H04N 5/2257

See application file for complete search history.

(56) References Cited

U.S. PATENT DOCUMENTS

| | | |
|---|---|---|
| 2015/0123107 A1 | 5/2015 | Choi et al. |
| 2016/0293687 A1 | 10/2016 | Chang et al. |

(Continued)

FOREIGN PATENT DOCUMENTS

| | | |
|---|---|---|
| CN | 109300957 A | 2/2019 |
| EP | 3654382 | 5/2020 |

(Continued)

OTHER PUBLICATIONS

Extended European Search Report—European Application No. 21182625.0 dated Dec. 2, 2021, citing references listed within.

*Primary Examiner* — Stacy Khoo

(74) *Attorney, Agent, or Firm* — Cantor Colburn LLP

(57) ABSTRACT

A display device includes a display panel including a first display area including first pixels, and a second display area including a pixel portion, in which second pixels are disposed, and a transmission portion through which light is transmitted. The pixel portion of the second display area includes a base member, a metal layer disposed on the base member to define the transmission portion, a first active layer disposed on the metal layer and including a first material, and a first gate layer disposed on the first active layer. A hole is defined through the metal layer to overlap at least a part of the first active layer in a thickness direction.

20 Claims, 15 Drawing Sheets

(56) References Cited

U.S. PATENT DOCUMENTS

| | | | |
|---|---|---|---|
| 2018/0331124 A1* | 11/2018 | Cho | ................. H01L 27/156 |
| 2019/0259967 A1* | 8/2019 | Yang | ................. H01L 27/3258 |
| 2020/0083301 A1 | 3/2020 | Bok et al. | |
| 2020/0185484 A1* | 6/2020 | Cho | ................. H01L 27/3276 |

FOREIGN PATENT DOCUMENTS

| | | | |
|---|---|---|---|
| KR | 1020140125029 A | 10/2014 | |
| KR | 1020170049705 A | 5/2017 | |
| KR | 1020190064004 A | 6/2019 | |

* cited by examiner

DISPLAY DEVICE

This application claims priority to Korean Patent Application No. 10-2020-0084594, filed on Jul. 9, 2020, and all the benefits accruing therefrom under 35 U.S.C. 119, the content of which in its entirety is herein incorporated by reference.

BACKGROUND

1. Field

The disclosure relates to a display device.

2. Description of the Related Art

With the advance of information technology, display devices for displaying images have been more widely used in various fields. Such display devices are employed in various electronic devices such as smartphones, digital cameras, laptop computers, navigation devices, and smart televisions, for example. In a display device, where each of pixels of a display panel includes a light emitting element capable of emitting light by itself, an image may be displayed without a backlight unit for providing light to the display panel.

SUMMARY

With diversification of electronic devices employing display devices, it is desired for the display devices to be provided in various designs. In a smartphone, for example, the display area may be widened by removing holes disposed on the front surface of the display device. Sensor devices disposed in a hole disposed on the front surface of the display device may be disposed to overlap the display panel. Accordingly, some pixels of the display panel overlap the sensor devices, and may be affected by the sensor devices.

During a lighting inspection process of a pixel portion of the display panel, a part of the active wiring of a defective pixel may be removed to prevent lighting of the defective pixel. However, a metal layer disposed on the rear surfaces of some pixels overlapping the sensor devices may block transmission of a laser beam that removes a part of the active wiring.

Embodiments of the disclosure provide a display device in which a hole is defined through a metal layer disposed on a rear surface of a pixel portion of a second display area, so that when a defective pixel occurs in the pixel portion of the second display area, lighting of the defective pixel may be prevented by opening (or inactivating) an active wiring of the defective pixel through an inversion repair process, in which a laser of a specific wavelength is emitted thereto through the hole.

According to an embodiment of the disclosure, a display device comprises a display panel having a first display area including first pixels, and a second display area including a pixel portion in which second pixels are disposed, and a transmission portion through which light is transmitted. In such an embodiment, the pixel portion of the second display area comprises: a base member, a metal layer disposed on the base member to define the transmission portion, a first active layer disposed on the metal layer, where the first active layer includes a first material, and a first gate layer disposed on the first active layer. In such an embodiment, a hole is defined through the metal layer to overlap at least a part of the first active layer in a thickness direction of the display panel.

In an embodiment, each of the second pixels may include: a light emitting element, a first transistor which control a driving current supplied to the light emitting element, and a second transistor which selectively supply a data voltage to a first node, which is a first electrode of the first transistor. In such an embodiment, the hole may include a first hole overlapping a portion between an active area of the first transistor and an active area of the second transistor.

In an embodiment, the first hole may overlap a second electrode of the second transistor connected to the first node.

In an embodiment, each of the second pixels may further include: a third transistor which selectively connects a second node, which is a second electrode of the first transistor, to a third node, which is a gate electrode of the first transistor, a fourth transistor which selectively supplies a first initialization voltage to the third node, and a fifth transistor which selectively supplies a driving voltage to the first node. In such an embodiment, the hole may further include a second hole overlapping a portion between the active area of the first transistor and an active area of the fifth transistor.

In an embodiment, the second hole may overlap a second electrode of the fifth transistor connected to the first node.

In an embodiment, each of the second pixels may further include: a sixth transistor which selectively connects the second node to a fourth node, which is a first electrode of the light emitting element. In such an embodiment, the hole may further include a third hole overlapping a portion between the active area of the first transistor and an active area of the sixth transistor.

In an embodiment, the third hole may overlap a first electrode of the sixth transistor connected to the second node.

In an embodiment, each of the second pixels may further include: a seventh transistor which selectively supplies a second initialization voltage to the fourth node. In such an embodiment, the hole may further include a fourth hole overlapping a portion between the active area of the sixth transistor and an active area of the seventh transistor.

In an embodiment, the fourth hole may overlap a second electrode of the seventh transistor connected to the fourth node.

In an embodiment, the active areas of each of the first transistor, the second transistor, the fifth transistor, the sixth transistor, and the seventh transistor may be defined by a part of the first active layer.

In an embodiment, the pixel portion of the second display area may further include: a second gate layer disposed on the first gate layer, a second active layer disposed on the second gate layer, where the second active layer may include a second material different from the first material, and a third gate layer disposed on the second active layer. In such an embodiment, the active areas of each of the third transistor and the fourth transistor may be defined by a part of the second active layer.

In an embodiment, each of the second pixels may include: a light emitting element, a first transistor which controls a driving current supplied to the light emitting element, a second transistor which selectively supplies a data voltage to a first node, which is a first electrode of the first transistor, a third transistor which selectively connects a second node, which is a second electrode of the first transistor, to a third node, which is a gate electrode of the first transistor, a fourth transistor which selectively supplies a first initialization voltage to the third node, and a fifth transistor which selectively supplies a driving voltage to the first node. In such an embodiment, the hole may include a first hole overlapping a portion between an active area of the second transistor and an active area of the fifth transistor.

In an embodiment, the first hole may overlap each of a second electrode of the second transistor and a second electrode of the fifth transistor connected to the first node.

In an embodiment, each of the second pixels may further include: a sixth transistor which selectively connects the second node to a fourth node, which is a first electrode of the light emitting element, and a seventh transistor which selectively supplies a second initialization voltage to the fourth node. In such an embodiment, the hole may further include a second hole overlapping a portion between an active area of the first transistor and an active area of the seventh transistor.

In an embodiment, the second hole may overlap an active area of the sixth transistor.

In an embodiment, the second hole may overlap a first electrode of the sixth transistor connected to the second node, and overlaps a second electrode of the seventh transistor connected to the fourth node.

In an embodiment, the first hole and the second hole may be spaced apart from each other in a first direction, and may extend in a second direction crossing the first direction.

In an embodiment, each of the second pixels may include: a light emitting element, a first transistor which controls a driving current supplied to the light emitting element, a second transistor which selectively supplies a data voltage to a first node, which is a first electrode of the first transistor, a third transistor which selectively connects a second node, which is a second electrode of the first transistor, to a third node, which is a gate electrode of the first transistor, a fourth transistor which selectively supplies a first initialization voltage to the third node, a fifth transistor which selectively supplies a driving voltage to the first node, a sixth transistor which selectively connects the second node to a fourth node, which is a first electrode of the light emitting element, and a seventh transistor which selectively supplies a second initialization voltage to the fourth node. In such an embodiment, the hole may overlap a portion between an active area of the second transistor and an active area of the seventh transistor.

In an embodiment, the hole may be bent at least once along the first active layer.

In an embodiment, the hole may overlap each of a second electrode of the second transistor connected to the first node, a second electrode of the fifth transistor connected to the first node, a first electrode of the sixth transistor connected to the second node, and a second electrode of the seventh transistor connected to the fourth node.

In embodiments of the invention, the display device may include a metal layer disposed between a pixel portion of a second display area and a base member to define a transmission portion and the pixel portion of the second display area, and a hole is defined through the metal layer to overlap at least a part of an active layer of the pixel portion in a thickness direction. Accordingly, when a defective pixel occurs in the pixel portion of the second display area, the active wiring of the defective pixel may be opened through an inversion repair process, in which a laser of a specific wavelength is emitted thereto through the hole, thereby preventing lighting of the defective pixel.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
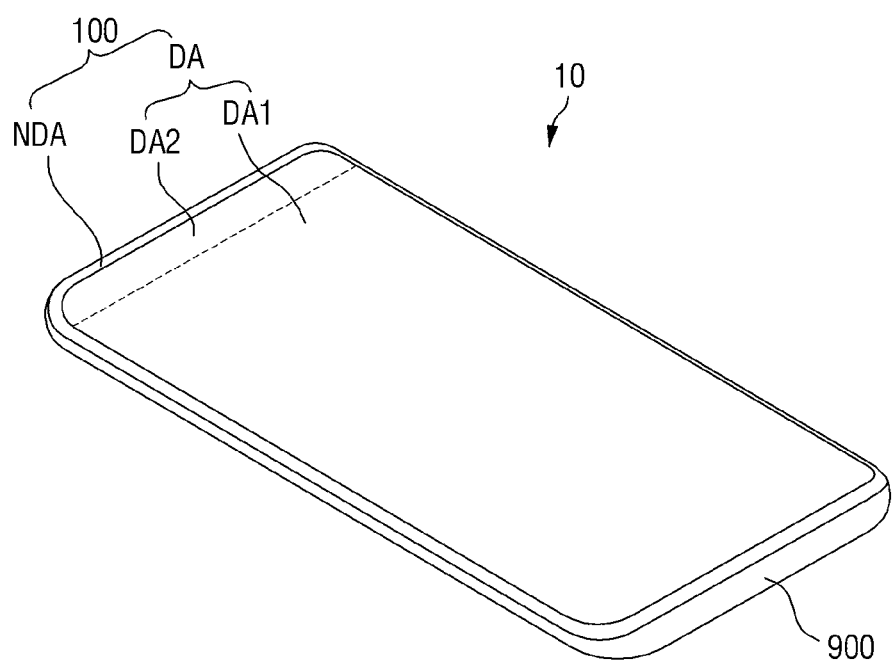
FIG. 1 is a perspective view illustrating a display device according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various embodiments. Further, various exemplary embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the invention will be described in detail with reference to the accompanying drawings.

Figure 2:
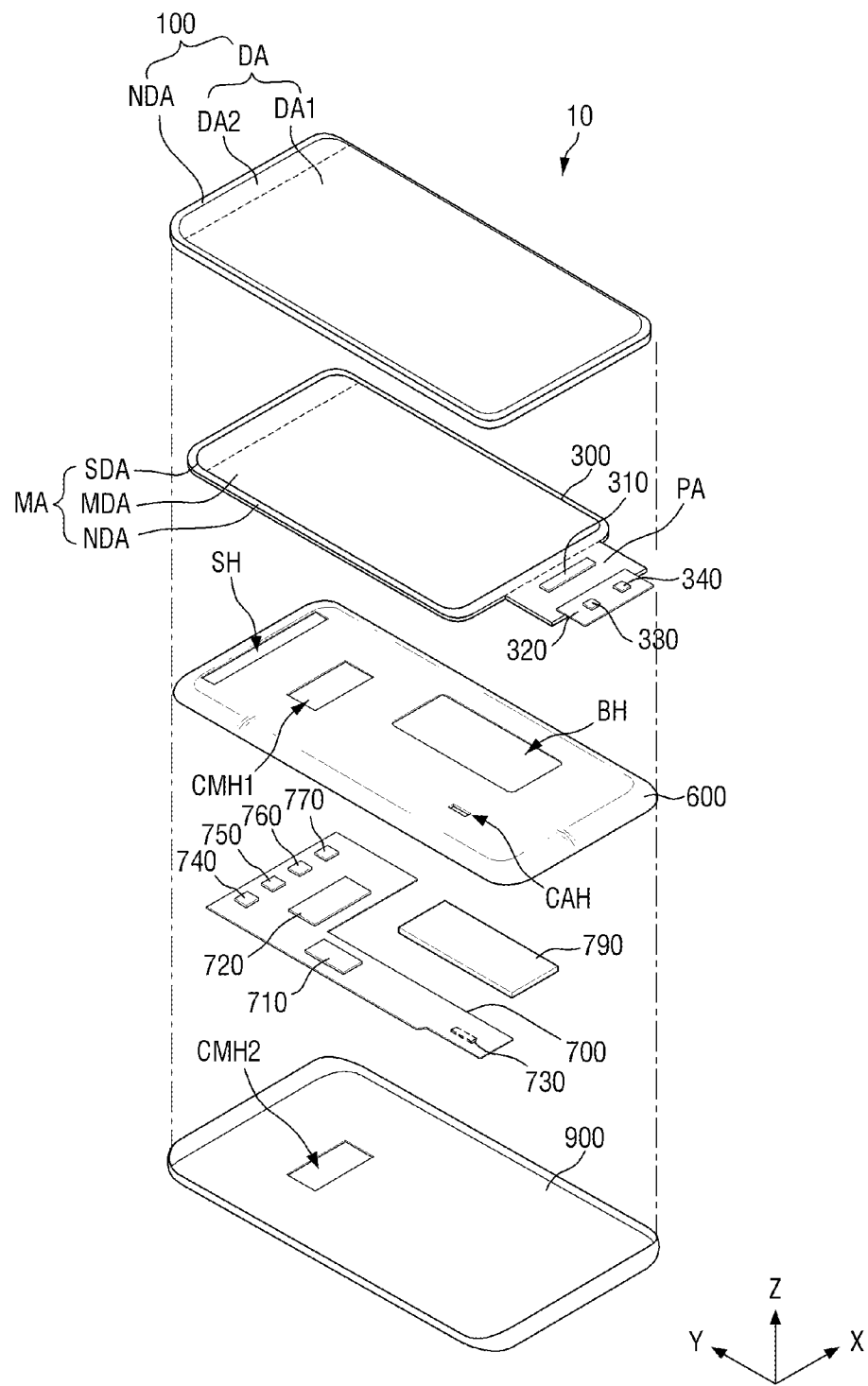
FIG. 2 is an exploded perspective view illustrating a display device according to an embodiment.

FIG. 1 is a perspective view illustrating a display device according to an embodiment. FIG. 2 is an exploded perspective view illustrating a display device according to an embodiment.

Referring to FIGS. 1 and 2, an embodiment of a display device 10 includes a cover window 100, a display panel 300, a bracket 600, a main circuit board 700, and a lower cover 900.

The terms "above," "top" and "top surface" as used herein refer to an upward direction (i.e., a Z-axis direction) with respect to the display device 10. The terms "below," "bottom" and "bottom surface" as used herein refer to a downward direction (i.e., a direction opposite to the Z-axis direction) with respect to the display device 10. Further, "left", "right", "upper" and "lower" indicate directions when the display device 10 is viewed from above. For example, the term "left" indicates a direction opposite to an X-axis direction, the term "right" indicates the X-axis direction, the term "upper" indicates a Y-axis direction, and the term "lower" indicates a direction opposite to the Y-axis direction.

The display device 10 is a device for displaying a moving image or a still image. The display device 10 may be used as a display screen of various products such as televisions, laptop computers, monitors, billboards and the Internet of Things ("TOT") as well as portable electronic devices such as mobile phones, smart phones, tablet personal computers (tablet "PC"s), smart watches, watch phones, mobile communication terminals, electronic notebooks, electronic books, portable multimedia players ("PMP"s), navigation systems and ultra-mobile PCs ("UMPC"s), for example.

The display device 10 may have a rectangular shape in a plan view. In one embodiment, for example, the display device 10 may have a rectangular shape, in a plan view, having short sides in a first direction (X-axis direction) and long sides in a second direction (Y-axis direction), as shown in FIGS. 1 and 2. The corner where the short side in the first direction (X-axis direction) and the long side in the second direction (Y-axis direction) meet may be rounded to have a predetermined curvature or may be right-angled. The planar shape of the display device 10 is not limited to a rectangular shape, and the display device 10 may be formed in another polygonal shape, a circular shape, or an elliptical shape.

The cover window 100 may be disposed on the display panel 300 to cover the top surface of the display panel 300. The cover window 100 may protect the top surface of the display panel 300.

The cover window 100 may include a transmission portion DA including a first transmission portion DA1 and a second transmission portion DA2 corresponding to the display panel 300, and a light blocking portion NDA corresponding to a region other than the display panel 300. The second transmission portion DA2 may be disposed on one side of the first transmission portion DA1, for example, on the upper side of the first transmission portion DA1, as illustrated in FIGS. 1 and 2. The light blocking portion NDA may be opaque. In an embodiment where the light blocking portion NDA does not display an image, the light blocking portion NDA may be a decorative layer that can be seen by a user.

The display panel 300 may be disposed below the cover window 100. Accordingly, the image displayed by the display panel 300 may be seen on the top surface of the display device 10 through the cover window 100.

The display panel 300 may be a light emitting display panel including a light emitting element. In one embodiment, for example, the display panel 300 may be an organic light emitting display panel using an organic light emitting diode including an organic light emitting layer, a micro light emitting diode display panel using a micro light emitting diode, a quantum dot light emitting display panel using a quantum dot light emitting diode including a quantum dot light emitting layer, or an inorganic light emitting display panel using an inorganic light emitting element including an inorganic semiconductor. Hereinafter, for convenience of description, an embodiment where the display panel 300 is an organic light emitting display panel will be mainly described, but not being limited thereto.

The display panel 300 may include a main area MA and a protruding area PA protruding from one side of the main area MA.

The main area MA may include a first display area MDA, a second display area SDA, and a non-display area NDA.

The first display area MDA may overlap the first transmission portion DA1 of the cover window 100. The second display area SDA may overlap the second transmission portion DA2 of the cover window 100. The second display area SDA may be disposed at one side of the first display area MDA, for example, at the upper side of the first display area MDA, as illustrated in FIG. 2, but the disclosure is not limited thereto. In one alternative embodiment, for example, the second display area SDA may be disposed to be surrounded by the first display area MDA, and may be disposed adjacent to the corner of the display panel 300. In one embodiment, as shown in FIG. 2, the display panel 300 includes a single second display area SDA, but the disclosure is not limited thereto. In one alternative embodiment, for example, the display panel 300 may include a plurality of second display areas SDA.

Each of the first display area MDA and the second display area SDA may include a plurality of pixels, scan lines and data lines connected to the plurality of pixels, and a power supply line.

The non-display area NDA may be defined as an edge area of the display panel 300. The non-display area NDA may include a scan driver for applying gate signals to the scan lines, and link lines for connecting the data lines to a display driver 310.

The protruding area PA may protrude from one side of the main area MA. In an embodiment, as shown in FIG. 2, the protruding area PA may protrude from the lower side of the first display area MDA. In one embodiment, for example, the length of the protruding area PA in the first direction (X-axis direction) may be smaller than the length of the main area MA in the first direction (X-axis direction).

In an embodiment, the protruding area PA may include a bending area and a pad area. In such an embodiment, the pad area may be disposed on one side of the bending area, and the main area MA may be disposed on an opposing side of the bending area. In one embodiment, for example, the pad area may be disposed on the lower side of the bending area, and the main area MA may be disposed on the upper side of the bending area.

In an embodiment, the display panel 300 may be flexible or formed flexibly such that the display panel 300 may be twisted, bent, folded, or rolled. In such an embodiment, the display panel 300 may be bent in the thickness direction (Z-axis direction) in the bending area.

The display panel 300 may include a display driver 310, a circuit board 320, a power supply unit 330, and a touch driver 340.

The display driver 310 may output signals and voltages for driving the display panel 300. In one embodiment, for example, the display driver 310 may supply a data voltage to the data line. In such an embodiment, the display driver 310 may supply a power voltage to the power line, and may supply a scan control signal to the scan driver.

The circuit board 320 may be attached on pads using an anisotropic conductive film ("ACF"). In an embodiment, lead lines of the circuit board 320 may be electrically connected to the pads of the display panel 300. In one embodiment, for example, the circuit board 320 may be a flexible printed circuit board, a printed circuit board ("PCB"), or a flexible film such as a chip on film ("COF").

The power supply unit 330 may be disposed on the circuit board 320 to supply a driving voltage to the display driver 310 and the display panel 300. In an embodiment, the power supply unit 330 may generate a driving voltage and supply the driving voltage to a driving voltage line, and the power supply unit 330 may generate a common voltage and supply the common voltage to a cathode electrode of a light emitting element of each of sub-pixels. In one embodiment, for example, the driving voltage may be a high potential voltage for driving the light emitting element, and the common voltage may be a low potential voltage for driving the light emitting element.

The touch driver 340 may be disposed on the circuit board 320 to measure the capacitance of touch electrodes. In one embodiment, for example, the touch driver 340 may determine whether the user has touched, the position of the user's touch and the like, based on the change in capacitance of the touch electrodes. Here, the user's touch means that an object such as a user's finger or pen is in direct contact with one surface of the display device 10 disposed on a touch sensing layer. In such an embodiment, the touch driver 340 may determine the user's touch position by distinguishing a portion of the plurality of touch electrodes where the user's touch occurs from a portion where no user's touch occurs.

The bracket 600 may be disposed below the display panel 300. The bracket 600 may include or be made of a plastic, a metal, or a combination thereof. In one embodiment, for example, a first camera hole CMH1, into which a first camera sensor 720 is inserted, a battery hole BH, in which a battery is disposed, a cable hole CAH, through which a cable connected to the display driver 310 or the circuit board 320 passes, and a sensor hole SH, in which sensor devices 740, 750, 760 and 770 are disposed, are defined through the bracket 600. In one alternative embodiment, for example, the sensor hole SH may be omitted, and the bracket 600 may be disposed not to overlap the second display area SDA of the display panel 300.

The main circuit board 700 and the battery 790 may be disposed below the bracket 600. The main circuit board 700 may be a PCB or a flexible printed circuit board ("FPCB").

The main circuit board 700 may include a main processor 710, a first camera sensor 720, a main connector 730, and sensor devices 740, 750, 760 and 770. The first camera sensor 720 may be disposed on both the top and bottom surfaces of the main circuit board 700, the main processor 710 may be disposed on the top surface of the main circuit board 700, and the main connector 730 may be disposed on the bottom surface of the main circuit board 700. The sensor devices 740, 750, 760 and 770 may be disposed on the top surface of the main circuit board 700.

The main processor 710 may control entire functions of the display device 10. In one embodiment, for example, the main processor 710 may supply digital video data to the display driver 310 such that the display panel 300 displays an image. The main processor 710 may receive touch data from the touch driver 340 and determine the user's touch coordinates, and then execute an application indicated by an icon displayed at the user's touch coordinates. In such an embodiment, the main processor 710 may control the display device 10 based on sensor signals inputted from the sensor devices 740, 750, 760 and 770.

The first camera sensor 720 may process an image frame of a still image or video obtained by the image sensor and output the image frame or the video to the main processor 710. the bracket 600 may include example, the first camera sensor 720 may be a complementary metal oxide semiconductor ("CMOS") image sensor or a charge coupled device ("CCD") sensor, but is not limited thereto. The first camera sensor 720 may be exposed to the bottom surface of the lower cover 900 through a second camera hole CMH2 defined through the lower cover 900, and capture an image of a background or an object disposed below the display device 10.

A cable passing through the cable hole CAH of the bracket 600 may be connected to the main connector 730. Thus, the main circuit board 700 may be electrically connected to the display driver 310 or the circuit board 320.

The sensor devices may include a proximity sensor 740, an illuminance sensor 750, an iris sensor 760, and a second camera sensor 770.

The proximity sensor 740 may detect whether an object is close to the top surface of the display device 10. In one embodiment, for example, the proximity sensor 740 may include a light source that outputs light and a light receiver that receives light reflected by an object. The proximity sensor 740 may determine whether there is an object located close to the top surface of the display device 10 based on the amount of light reflected by the object. Since the proximity sensor 740 overlaps the sensor hole SH, the second display area SDA of the display panel 300 and the second transmission portion DA2 of the cover window 100 in the thickness direction (Z-axis direction) of the display panel 300, the proximity sensor 740 may generate a proximity sensor signal indicating whether there is an object located close to the top surface of the display device 10 and output the proximity sensor signal to the main processor 710.

The illuminance sensor 750 may detect the brightness of the top surface of the display device 10. The illuminance sensor 750 may include a resistor whose resistance value changes according to the brightness of the incident light. The illuminance sensor 750 may determine the brightness of the top surface of the display device 10 according to the resistance value of the resistor. Since the illuminance sensor 750 overlaps the sensor hole SH, the second display area SDA of the display panel 300 and the second transmission portion DA2 of the cover window 100 in the thickness direction (Z-axis direction) of the display panel 300, the illuminance sensor 750 may generate an illuminance sensor signal according to the brightness of the top surface of the display device 10 and output the illuminance sensor signal to the main processor 710.

The iris sensor 760 may detect whether the image of the user's iris is the same as the iris image previously stored in the memory. The iris sensor 760 may generate and output an iris sensor signal to the main processor 710 according to whether the user's iris image is the same as the iris image previously stored in the memory.

The second camera sensor 770 may process an image frame of a still image or video obtained by the image sensor and output the image frame or the video to the main processor 710. In one embodiment, for example, the second camera sensor 770 may be a CMOS image sensor or a CCD sensor, but is not limited thereto. The number of pixels of the second camera sensor 770 may be less than the number of pixels of the first camera sensor 720, and the size of the second camera sensor 770 may be smaller than the size of the first camera sensor 720. Since the second camera sensor 770 overlaps the sensor hole SH, the second display area SDA of the display panel 300 and the second transmission portion DA2 of the cover window 100 in the thickness direction (Z-axis direction) of the display panel 300, the second camera sensor 770 may capture an image of a background or an object disposed above the display device 10.

The battery 790 may be disposed not to overlap the main circuit board 700 in a third direction (Z-axis direction). The battery 790 may overlap the battery hole BH of the bracket 600.

The main circuit board 700 may further include a mobile communication module capable of transmitting and receiving radio signals with at least one of a base station, an external terminal, and a server in a mobile communication network. The radio signal may include various types of data according to transmission and reception of a voice signal, a video call signal, or a message.

The lower cover 900 may be disposed below the main circuit board 700 and the battery 790. The lower cover 900 may be fixed by being fastened to the bracket 600. The lower cover 900 may define or form an external appearance of the bottom surface of the display device 10. The lower cover 900 may include or be made of a plastic, a metal, or a combination thereof.

The second camera hole CMH2, through which the bottom surface of the first camera sensor 720 is exposed, is defined through the lower cover 900. The position of the first camera sensor 720 and the positions of the first and second camera holes CMH1 and CMH2 corresponding to the first camera sensor 720 are not limited to those illustrated in FIG. 2.

Figure 3:
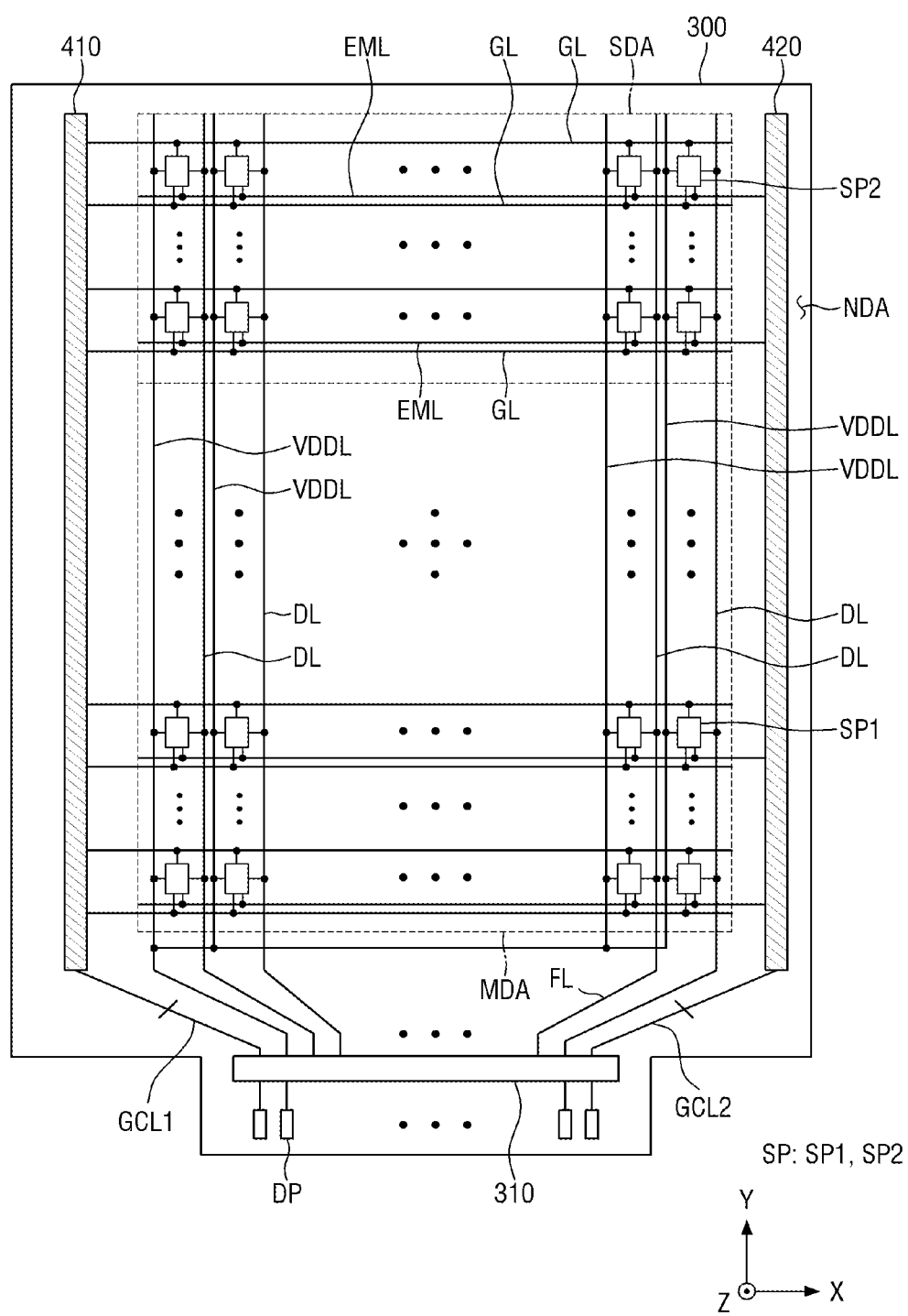
FIG. 3 is a plan view illustrating a display panel according to an embodiment.
Figure 4:
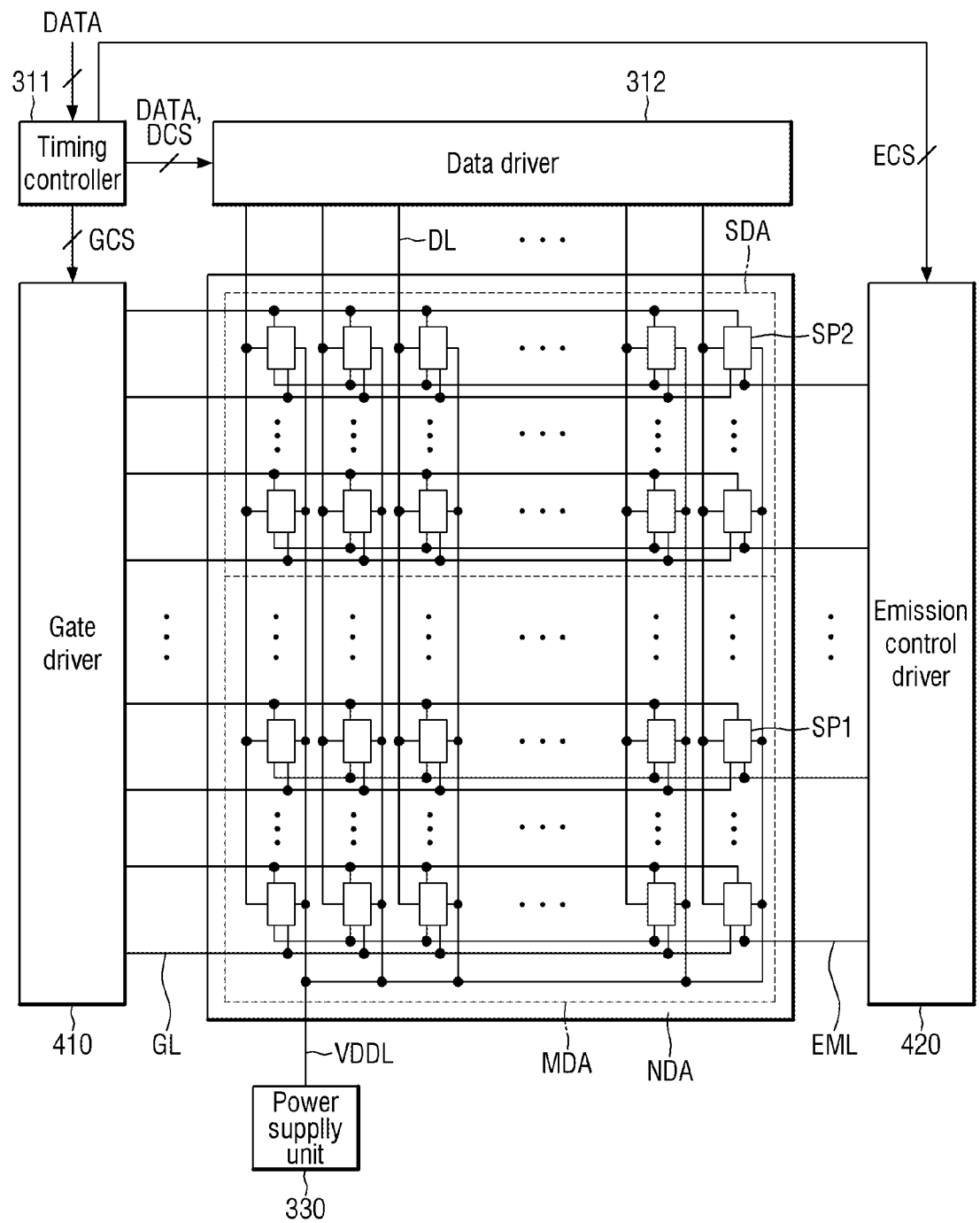
FIG. 4 is a block diagram illustrating a display panel and a display driver according to an embodiment.

FIG. 3 is a plan view illustrating a display panel according to an embodiment. FIG. 4 is a block diagram illustrating a display panel and a display driver according to an embodiment.

Referring to FIGS. 3 and 4, an embodiment of the display panel 300 may include a first display area MDA, a second display area SDA, and a non-display area NDA.

The first display area MDA may include first pixels SP1, driving voltage lines VDDL connected to the first pixels SP1, gate lines GL, emission control lines EML, and data lines DL.

Each of the first pixels SP1 may be connected to a corresponding gate line GL, a corresponding data line DL, a corresponding emission control line EML, and a corresponding driving voltage line VDDL. In an embodiment, as shown in FIGS. 3 and 4, each of the first pixels SP1 may be connected to two gate lines GL, a single data line DL, a single emission control line EML, and a single driving voltage line VDDL, but the disclosure is not necessarily limited thereto. In one alternative embodiment, for example, each of the first pixels SP1 may be connected to three or more gate lines SL.

Each of the first pixels SP1 may include a switching transistor, a light emitting element and a capacitor.

The first pixels SP1 may receive a driving voltage VDD through a driving voltage line VDDL. In an embodiment, the driving voltage VDD may be a high potential voltage for driving the light emitting element of the first pixels SP1.

The gate lines GL and the emission control lines EML may extend in the first direction (X-axis direction) and may be spaced apart from each other in the second direction (Y-axis direction) intersecting the first direction (X-axis direction).

The data lines DL and the driving voltage lines VDDL may extend in the second direction (Y-axis direction) and may be spaced apart from each other in the first direction (X-axis direction).

The second display area SDA may include second pixels SP2, and driving voltage lines VDDL, gate lines GL, emission control lines EML, and data lines DL connected to the second pixels SP2.

Each of the second pixels SP2 may be connected to a corresponding gate line GL, a corresponding data line DL, a corresponding emission control line EML, and a corresponding driving voltage line VDDL. In an embodiment, as shown in FIGS. 3 and 4, each of the second pixels SP2 may be connected to two gate lines GL, a single data line DL, a single emission control line EML, and a single driving voltage line VDDL, but the disclosure is not necessarily limited thereto. In one alternative embodiment, for example, each of the second pixels SP2 may be connected to three or more gate lines GL.

Each of the second pixels SP2 may include a switching transistor, a light emitting element and a capacitor.

The second pixels SP2 may receive a driving voltage VDD through a driving voltage line VDDL. In an embodiment, the driving voltage VDD may be a high potential voltage for driving the light emitting element of the second pixels SP2.

In one embodiment, for example, the number of first pixels SP1 per unit area (or a pixel density) of the first display area MDA may be greater than the number of second pixels SP2 per unit area of the second display area SDA. The first display area MDA is an area for displaying an image, which is a main function of the display device 10, and the first pixels SP1 may be densely arranged therein. The second display area SDA may include a pixel portion, in which the second pixels SP2 are disposed, and a transmission portion that transmits light. Accordingly, as the area of the transmission area of the second display area SDA increases, the number of second pixels SP2 per unit area may be smaller than the number of first pixels SP1 per unit area.

The non-display area NDA may be defined as the remaining area of the display panel 300 except for the first display area MDA and the second display area SDA. The non-display area NDA may include a gate driver 410 for applying gate signals to the gate lines GL, an emission control driver 420 for applying emission signals to the emission control lines EML, fan-out lines FL connecting the data lines DL to the display driver 310 and pads DP connected to the circuit board 320. The display driver 310 and the pads DP may be disposed in the pad area of the display panel 300. The pads DP may be disposed closer to one edge of the pad area than the display driver 310.

In an embodiment, as shown in FIG. 4, the display driver 310 may include a timing controller 311 and a data driver 312.

The timing controller 311 may receive digital video data DATA and timing signals from the circuit board 320. The timing controller 311 may generate a gate control signal GCS based on the timing signals to control the operation timing of the gate driver 410, generate an emission control signal ECS to control the operation timing of an emission control driver 420, and generate a data control signal DCS to control the operation timing of the data driver 312. The timing controller 311 may output the gate control signal GCS to the gate driver 410 through a first gate control line GCL1. The timing controller 311 may output the emission control signal ECS to the emission control driver 420 through a second gate control line GCL2. The timing controller 311 may output the digital video data DATA and the data control signal DCS to the data driver 312.

The data driver 312 may convert the digital video data DATA into data voltages in analog form and output the data voltages to the data lines DL through the fan-out lines FL. The gate signals of the gate driver 410 may select pixels SP to which the data voltage is supplied, and the selected pixels SP may receive the data voltage through the data lines DL.

In an embodiment, as shown in FIG. 3, the gate driver 410 may be disposed outside one side of the first display area MDA and the second display area SDA or on one side of the non-display area NDA. The emission control driver 420 may be disposed outside an opposing side of the first display area MDA and the second display area SDA or on the opposing side of the non-display area NDA. In an alternative embodiment, both the gate driver 410 and the emission control driver 420 may be disposed outside one side of the first display area MDA and the second display area SDA.

The gate driver 410 may include a plurality of thin film transistors for generating gate signals based on the gate control signal GCS, and the emission control driver 420 may include a plurality of thin film transistors for generating emission signals based on the emission control signal ECS. In one embodiment, for example, the thin film transistors of the gate driver 410 and the thin film transistors of the emission control driver 420 may be disposed in a same layer as the thin film transistors of the first and second sub-pixels SP1 and SP2, respectively.

Figure 5:
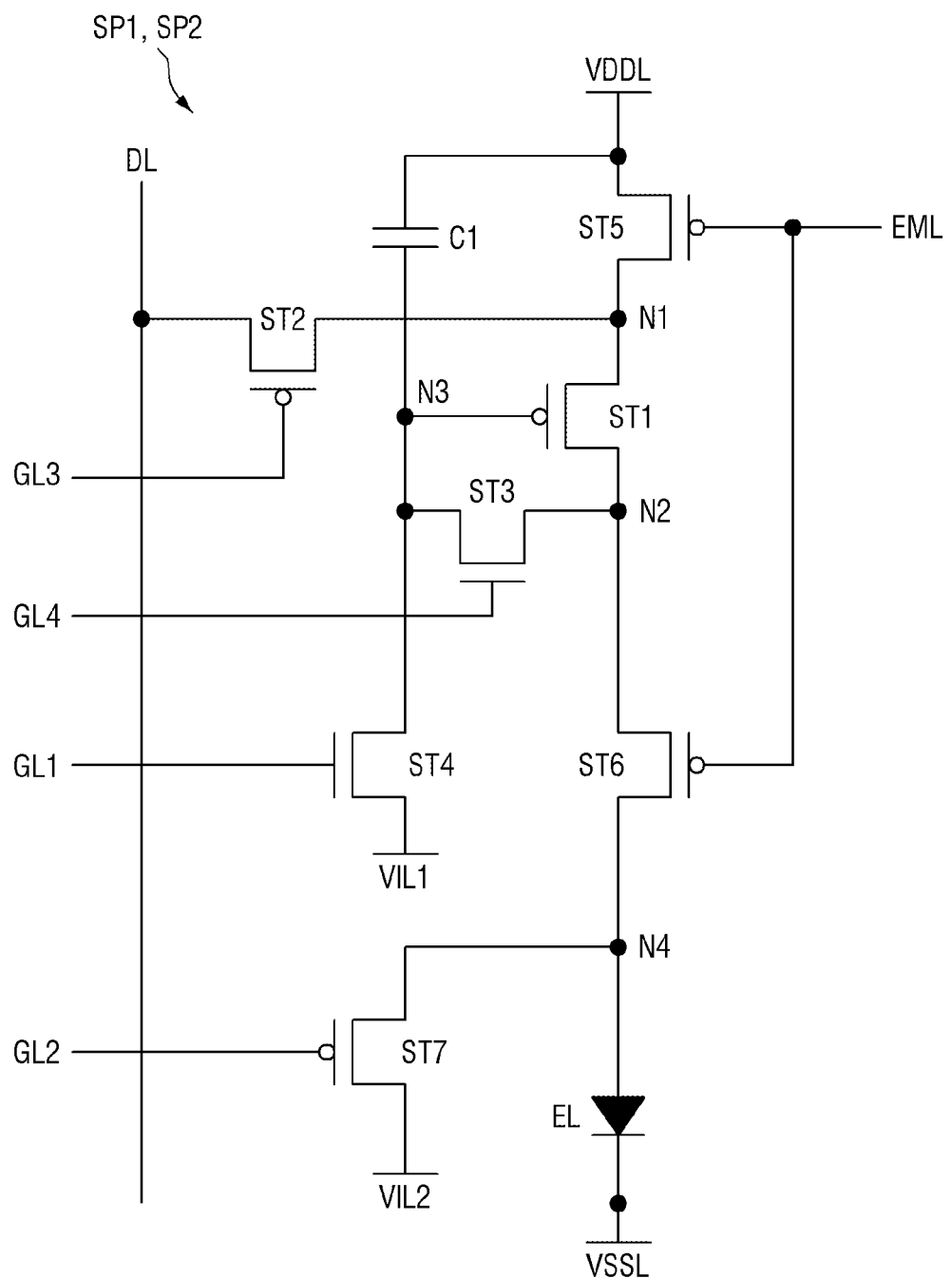
FIG. 5 is a circuit diagram illustrating a pixel of a display device according to an embodiment.
Figure 6:
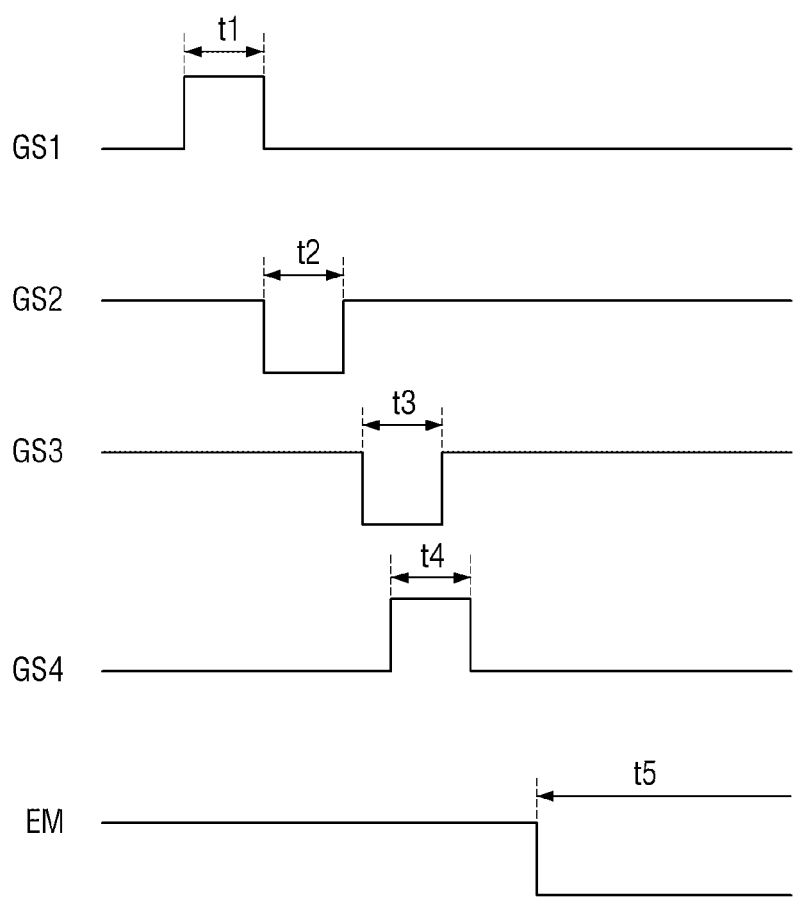
FIG. 6 is a waveform diagram of signals supplied to the pixel shown in FIG. 5.

FIG. 5 is a circuit diagram illustrating a pixel of a display device according to an embodiment. FIG. 6 is a waveform diagram of signals supplied to the pixel shown in FIG. 5.

Referring to FIGS. 5 and 6, an embodiment of the display panel 300 may include first pixels SP1 of the first display area MDA and second pixels SP2 of the second display area SDA.

Each of the first and second pixels SP1 and SP2 may be connected to a first gate line GL1, a second gate line GL2, a third gate line GL3, a fourth gate line GL4, and an emission control line EML, a data line DL, a driving voltage line VDDL or VSSL, a first initialization voltage line VIL1, and a second initialization voltage line VIL2.

Each of the first and second pixels SP1 and SP2 may include a light emitting element EL and a pixel circuit for driving the light emitting element EL. The pixel circuit may include a plurality of switching elements and a capacitor. The plurality of switching elements may include first to seventh transistors ST1, ST2, ST3, ST4, ST5, ST6, and ST7.

The first transistor ST1 may control a driving current supplied to the light emitting element EL. The first transistor ST1 may include a gate electrode, a first electrode, and a second electrode. The gate electrode of the first transistor ST1 may be connected to a third node N3, the first electrode thereof may be connected to a first node N1, and the second electrode thereof may be connected to a second node N2. In one embodiment, for example, the first electrode of the first transistor ST1 may be a source electrode and the second electrode of the first transistor ST1 may be a drain electrode, but the disclosure is not limited thereto.

The first transistor ST1 may control a source-drain current (Isd) (hereinafter, referred to as "driving current") based on the data voltage applied to the gate electrode. The driving current (Isd) flowing through the channel of the first transistor ST1 may be proportional to the square of a difference between a threshold voltage (Vth) and a voltage (Vsg) between the source electrode and the gate electrode of the first transistor ST1 (i.e., $Isd=k\times(Vsg-Vth)^2$). Here, k denotes a proportional coefficient determined by the structure and physical characteristics of the first transistor ST1, Vsg denotes a source-gate voltage of the first transistor ST1, and Vth denotes a threshold voltage of the first transistor ST1.

The light emitting element EL may emit light by receiving the driving current (Isd). The emission amount or the luminance of the light emitting element EL may be proportional to the magnitude of the driving current (Isd). The light emitting element EL may include a first electrode, a second electrode, and a light emitting layer disposed between the first electrode and the second electrode. The first electrode of the light emitting element EL may be connected to a fourth node N4. The second electrode of the light emitting element EL may be connected to another driving voltage line VSSL. The first electrode of the light emitting element EL may be connected to the second electrode of the sixth transistor ST6 and the second electrode of the seventh transistor ST7 through the fourth node N4. In one embodiment, for example, the first electrode of the light emitting element EL may be an anode electrode, and the second electrode of the light emitting element EL may be a cathode electrode, but the disclosure is not limited thereto.

The second transistor ST2 may be turned on by a third gate signal GS3 of the third gate line GL3 to connect the data line DL to the first node N1 which is the first electrode of the first transistor ST1. The second transistor ST2 may be turned on based on the third gate signal GS3 to supply the data voltage to the first node N1. The gate electrode of the second transistor ST2 may be connected to the third gate line GL3, the first electrode thereof may be connected to the data line DL, and the second electrode thereof may be connected to the first node N1. The second electrode of the second transistor ST2 may be connected to the first electrode of the first transistor ST1 and the second electrode of the fifth transistor ST5 through the first node N1. In one embodiment, for example, the first electrode of the second transistor ST2 may be a source electrode and the second electrode of the second transistor ST2 may be a drain electrode, but the disclosure is not limited thereto.

The third transistor ST3 may be turned on by a fourth gate signal GS4 of the fourth gate line GL4 to connect the second node N2, which is the second electrode of the first transistor ST1, to the third node N3, which is the gate electrode of the first transistor ST1. The gate electrode of the third transistor ST3 may be connected to the fourth gate line GL4, the first electrode thereof may be connected to the second node N2, and the second electrode thereof may be connected to the third node N3. The first electrode of the third transistor ST3 may be connected to the second electrode of the first transistor ST1 and the first electrode of the sixth transistor ST6 through the second node N2. The second electrode of the third transistor ST3 may be connected to the gate electrode of the first transistor ST1, the second electrode of the fourth transistor ST4, and the first electrode of a capacitor C1 through the third node N3. In one embodiment, for example, the first electrode of the third transistor ST3 may be a drain electrode and the second electrode of the third transistor ST3 may be a source electrode, but is not limited thereto.

The fourth transistor ST4 may be turned on by the first gate signal GS1 of the first gate line GL1 to connect the first initialization voltage line VIL to the third node N3, which is the gate electrode of the first transistor ST1. The fourth transistor ST4 may be turned on based on the first gate signal GS1, thereby discharging the gate electrode of the first transistor ST1 to a first initialization voltage. The gate electrode of the fourth transistor ST4 may be connected to the first gate line GL1, the first electrode thereof may be connected to the first initialization voltage line VIL1, and the second electrode thereof may be connected to the third node N3. The second electrode of the fourth transistor ST4 may be connected to the gate electrode of the first transistor ST1, the second electrode of the third transistor ST3, and the first electrode of the capacitor C1 through the third node N3. In one embodiment, for example, the first electrode of the fourth transistor ST4 may be a drain electrode and the second electrode of the fourth transistor ST4 may be a source electrode, but is not limited thereto.

The fifth transistor ST5 may be turned on by an emission signal EM of the emission control line EML to connect the driving voltage line VDDL to the first node N1, which is the first electrode of the first transistor ST1. The gate electrode of the fifth transistor ST5 may be connected to the emission control line EML, the first electrode thereof may be connected to the driving voltage line VDDL, and the second electrode thereof may be connected to the first node N1. The second electrode of the fifth transistor ST5 may be electrically connected to the first electrode of the first transistor ST1 and the second electrode of the second transistor ST2 through the first node N1. In one embodiment, for example, the first electrode of the fifth transistor ST5 may be a source electrode and the second electrode of the fifth transistor ST5 may be a drain electrode, but the disclosure is not limited thereto.

The sixth transistor ST6 may be turned on by the emission signal EM of the emission control line EML to connect the second node N2, which is the second electrode of the first transistor ST1, to the fourth node N4, which is the first electrode of the plurality of light emitting elements EL. The gate electrode of the sixth transistor ST6 may be connected to the emission control line EML, the first electrode thereof may be connected to the second node N2, and the second electrode thereof may be connected to the fourth node N4. The first electrode of the sixth transistor ST6 may be connected to the second electrode of the first transistor ST1 and the first electrode of the third transistor ST3 through the second node N2. The second electrode of the sixth transistor ST6 may be connected to the first electrode of the light emitting element EL and the second electrode of the seventh transistor ST7 through the fourth node N4. In one embodiment, for example, the first electrode of the sixth transistor ST6 may be a source electrode and the second electrode of the sixth transistor ST6 may be a drain electrode, but the disclosure is not limited thereto.

When all of the fifth transistor ST5, the first transistor ST1, and the sixth transistor ST6 are turned on, the driving current (Isd) may be supplied to the plurality of light emitting elements EL.

The seventh transistor ST7 may be turned on by a second gate signal GS2 of the second gate line GL2 to connect the second initialization voltage line VIL2 to the fourth node N4 which is the first electrode of the light emitting element EL. The seventh transistor ST7 may be turned based on the second gate signal GS2, thereby discharging the first electrode of the light emitting element EL to a second initialization voltage. The gate electrode of the seventh transistor ST7 may be connected to the second gate line GL2, the first electrode thereof may be connected to the second initialization voltage line VIL2, and the second electrode thereof may be connected to the fourth node N4. The second electrode of the seventh transistor ST7 may be connected to the first electrode of the light emitting element EL and the second electrode of the sixth transistor ST6 through the fourth node N4.

Each of the first transistor ST1, the second transistor ST2, the fifth transistor ST5, the sixth transistor ST6, and the seventh transistor ST7 may include a silicon-based active area. In one embodiment, for example, each of the first transistor ST1, the second transistor ST2, the fifth transistor ST5, the sixth transistor ST6, and the seventh transistor ST7 may include an active area including or made of low temperature polycrystalline silicon ("LTPS"). The active area including or made of LTPS may have high electron mobility and excellent turn-on characteristics. Accordingly, in such an embodiment where the display device 10 includes the first transistor ST1, the second transistor ST2, the fifth transistor ST5, the sixth transistor ST6, and the seventh transistor ST7 having high turn-on characteristics, a plurality of pixels SP may be driven stably and efficiently.

Each of the first transistor ST1, the second transistor ST2, the fifth transistor ST5, the sixth transistor ST6, and the seventh transistor ST7 may be a p-type transistor. In one embodiment, for example, each of the first transistor ST1, the second transistor ST2, the fifth transistor ST5, the sixth transistor ST6, and the seventh transistor ST7 may output a current flowing into the first electrode to the second electrode based on a gate low voltage applied to the gate electrode.

Each of the third transistor ST3 and the fourth transistor ST4 may include an oxide-based active area. In one embodiment, for example, each of the third transistor ST3 and the fourth transistor ST4 may have a coplanar structure in which the gate electrode is disposed on the oxide-based active area. The transistor having a coplanar structure may have high off current characteristics and perform low frequency driving, thereby reducing power consumption. Accordingly, the display device 10 may include the third transistor ST3 and the fourth transistor ST4 having high off current characteristics, thereby effectively preventing a leakage current from flowing in the pixel, and stably maintaining the voltage in the pixel.

Each of the third transistor ST3 and the fourth transistor ST4 may be an n-type transistor. In one embodiment, for example, each of the third transistor ST3 and the fourth transistor ST4 may output a current flowing into the first electrode to the second electrode based on a gate high voltage applied to the gate electrode.

The capacitor C1 may be connected between the third node N3, which is the gate electrode of the first transistor ST1, and the driving voltage line VDDL. In one embodiment, for example, the first electrode of the capacitor C1 may be connected to the third node N3, and the second electrode of the capacitor C1 may be connected to the driving voltage line VDDL, thereby maintaining a potential difference between the driving voltage line VDDL and the gate electrode of the first transistor ST1.

Referring to FIG. 6 in conjunction with FIG. 5, an embodiment of the display device 10 may be driven through first to fifth periods t1 to t5 of one frame. The pixel SP may receive the first gate signal GS1, the second gate signal GS2, the third gate signal GS3, the fourth gate signal GS4, and the emission signal EM.

The fourth transistor ST4 may receive the first gate signal GS1 of a high level during the first period t1 of one frame. The fourth transistor ST4 may be turned on based on the first gate signal GS1 of a high level to supply the first initialization voltage to the third node N3, which is the gate electrode of the first transistor ST1. Accordingly, the fourth transistor ST4 may initialize the gate electrode of the first transistor ST1 during the first period t1.

The seventh transistor ST7 may receive the second gate signal GS2 of a low level during the second period t2 of the one frame. The seventh transistor ST7 may be turned on based on the second gate signal GS2 of a low level to supply the second initialization voltage to the fourth node N4 that is the first electrode of the light emitting element EL. Accordingly, the seventh transistor ST7 may initialize the first electrode of the light emitting element EL during the second period t2.

The second transistor ST2 may receive the third gate signal GS3 of a low level during the third period t3 of the one frame. The second transistor ST2 may be turned on based on the third gate signal GS3 of a low level to supply a data voltage Vdata to the first node N1 that is the first electrode of the first transistor ST1.

The third transistor ST3 may receive the fourth gate signal GS4 of a high level during the fourth period t4 of the one frame. The third transistor ST3 may be turned on based on the fourth gate signal GS4 of a high level, and may connect the second node N2 to the third node N3.

When the first electrode of the first transistor ST1 receives the data voltage (Vdata), a source-gate voltage (Vsg) of the first transistor ST1 may correspond to a difference voltage (Vdata−VI1) between the data voltage Vdata and the first initialization voltage (VI1), and the first transistor ST1 may be turned on because the source-gate voltage Vsg of the first transistor ST1 is greater than the threshold voltage (hereinafter, denoted by "Vth") (i.e., Vdata−VI1>=Vth). Accordingly, at the moment when the first transistor ST1 is turned on in the third period t3, the source-drain current (Isd) of the first transistor ST1 may be determined according to the data voltage (Vdata), the first initialization voltage (VI1), and the threshold voltage (Vth) of the first transistor ST1 (i.e., $Isd=k\times(Vdata-VI1-Vth)^2$). The first transistor ST1 may supply the source-drain current (Isd) to the second node N2 until the source-gate voltage (Vsg) reaches the threshold voltage (Vth) of the first transistor ST1.

In such an embodiment, the third transistor ST3 may be turned on for the fourth period t4 to supply the voltage of the second node N2 to the third node N3. In this manner, while the third transistor ST3 is turned on, the voltage of the third node N3 and the source-drain current (Isd) of the first transistor ST1 may be changed, and the voltage of the third node N3 may eventually converge to a difference voltage (Vdata-Vth) between the data voltage (Vdata) and the threshold voltage (Vth) of the first transistor ST1.

The emission signal EM may have a gate low voltage during the fifth period t5. When the emission signal EM has a low level, the fifth and sixth transistors ST5 and ST6 may be turned on to supply the driving current (Isd) to the light emitting element EL.

Figure 7:
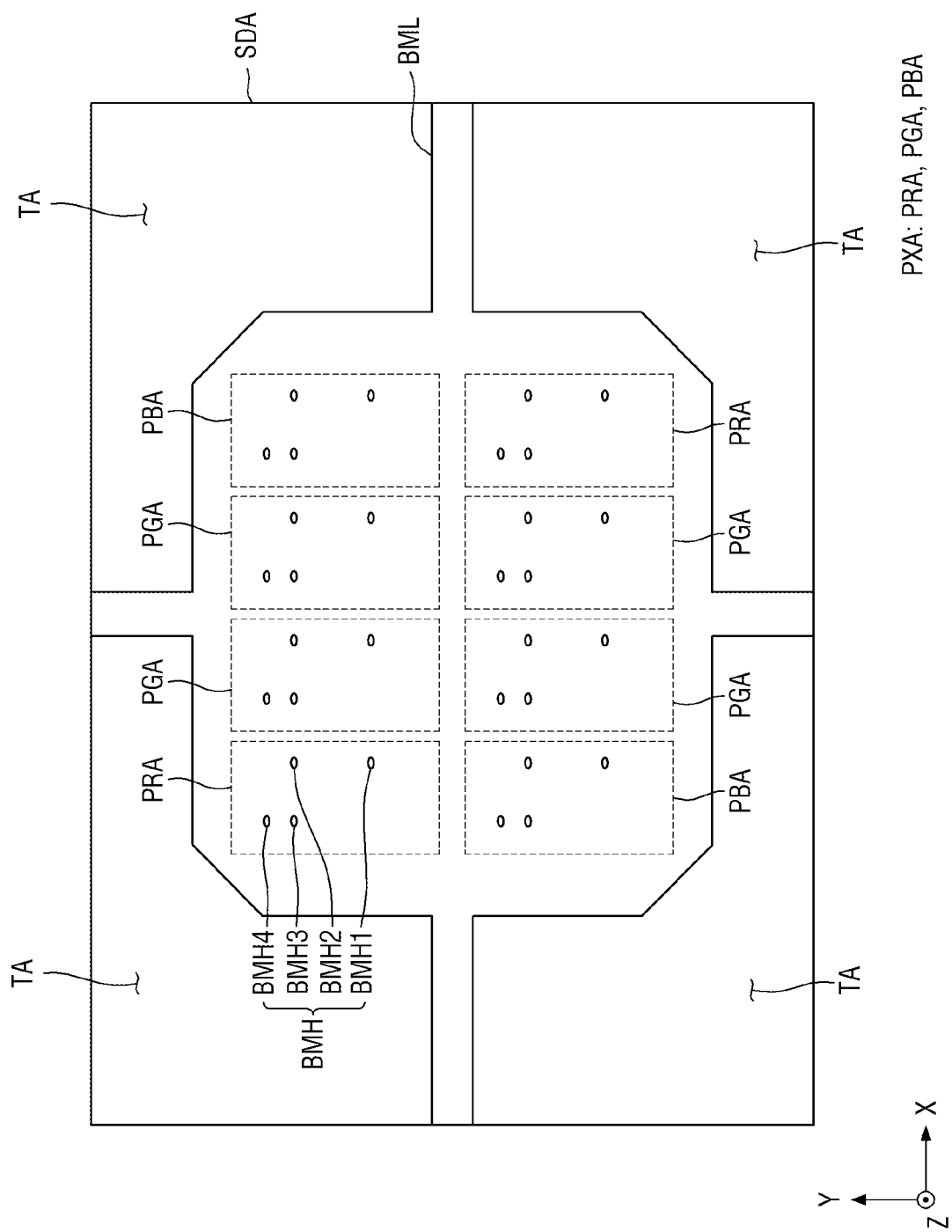
FIG. 7 is a plan view illustrating a metal layer of a display device according to an embodiment.

FIG. 7 is a plan view illustrating a metal layer of a display device according to an embodiment.

Referring to FIG. 7, the display panel 300 may include a first display area MDA and a second display area SDA, and the second display area SDA may include a pixel portion PXA and a transmission portion TA. A metal layer BML may be disposed between a base member and a thin film transistor layer to define the pixel portion PXA and the transmission portion TA. Referring to FIG. 7 in conjunction with FIG. 2, the metal layer BML may overlap the pixel portion PXA of the second display area SDA, thereby preventing light passed through the pixel portion PXA from reaching the sensor devices 740, 750, 760, and 770. The metal layer BML is disposed not to overlap the transmission portion TA of the second display area SDA, so that the transmission portion TA may allow light incident on the display panel 300 to pass therethrough almost as it is. Accordingly, even though the sensor devices 740, 750, 760, and 770 are disposed below the display panel 300, the sensor devices 740, 750, 760, and 770 may detect light incident from above the display panel 300.

The transmission portion TA may include a plurality of transmission portions TA separated by the metal layer BML. In one embodiment, for example, the plurality of transmission portions TA may be spaced apart from each other by the metal layer BML. The plurality of transmission portions TA may be surrounded by the metal layer BML. The plurality of transmission portions TA may be arranged along the first direction (X-axis direction) and the second direction (Y-axis direction).

In an embodiment, at least one hole BMH is defined through the metal layer BML. The at least one hole BMH may overlap at least a part of a first active layer disposed in the pixel portion PXA in the thickness direction (or the Z-axis direction). In an embodiment, at least one hole BMH is defined through the metal layer BML to overlap at least a part of the first active layer of the pixel portion PXA, thereby allowing the light having passed through the base member from the bottom of the pixel portion PXA to reach the first active layer.

In one embodiment, for example, the metal layer BML may be disposed not to overlap the first display area MDA, but is not limited thereto.

The pixel portion PXA may include first to third sub-pixel areas PRA, PGA, and PBA. The first to third sub-pixel areas PRA, PGA, and PBA may include first to third sub-pixels, respectively, that emit light of different colors from each other. The first to third sub-pixel areas PRA, PGA, and PBA may emit light by using the light emitting elements EL of the first to third sub-pixels, respectively.

In one embodiment, for example, the number of first pixels SP1 per unit area of the first display area MDA may be greater than the number of second pixels SP2 per unit area of the second display area SDA. The first display area MDA is an area for displaying an image, which is a main function of the display device 10, and the first pixels SP1 may be densely arranged therein. The second display area SDA may include a pixel portion PXA in which the second pixels SP2 are disposed and a transmission portion TA that transmits light. Accordingly, as the size of the transmission area of the second display area SDA increases, the number of second pixels SP2 per unit area may be smaller than the number of first pixels SP1 per unit area.

Figure 8:
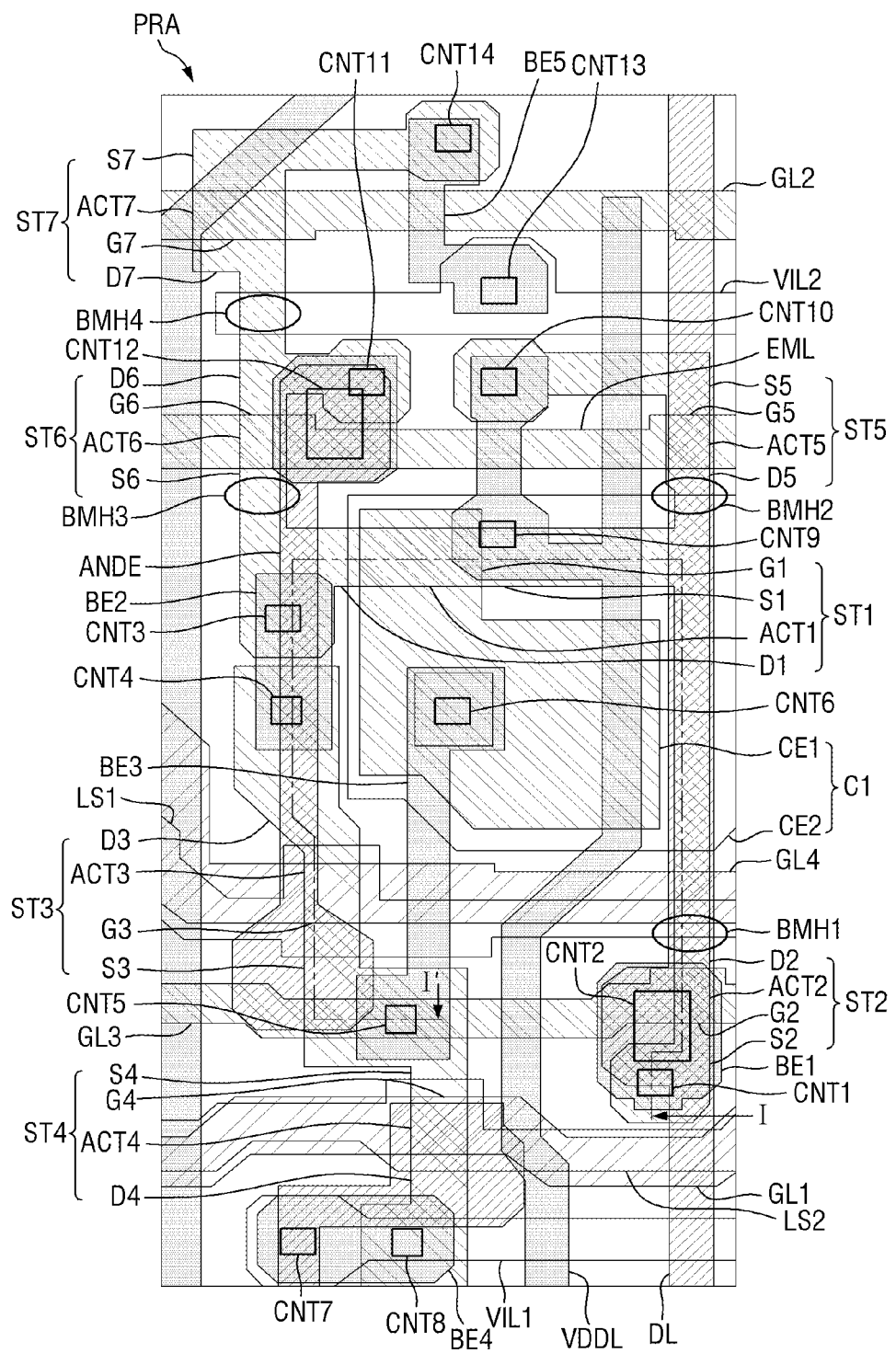
FIG. 8 is a plan view illustrating a first sub-pixel of a pixel portion in a display device according to an embodiment.
Figure 9:
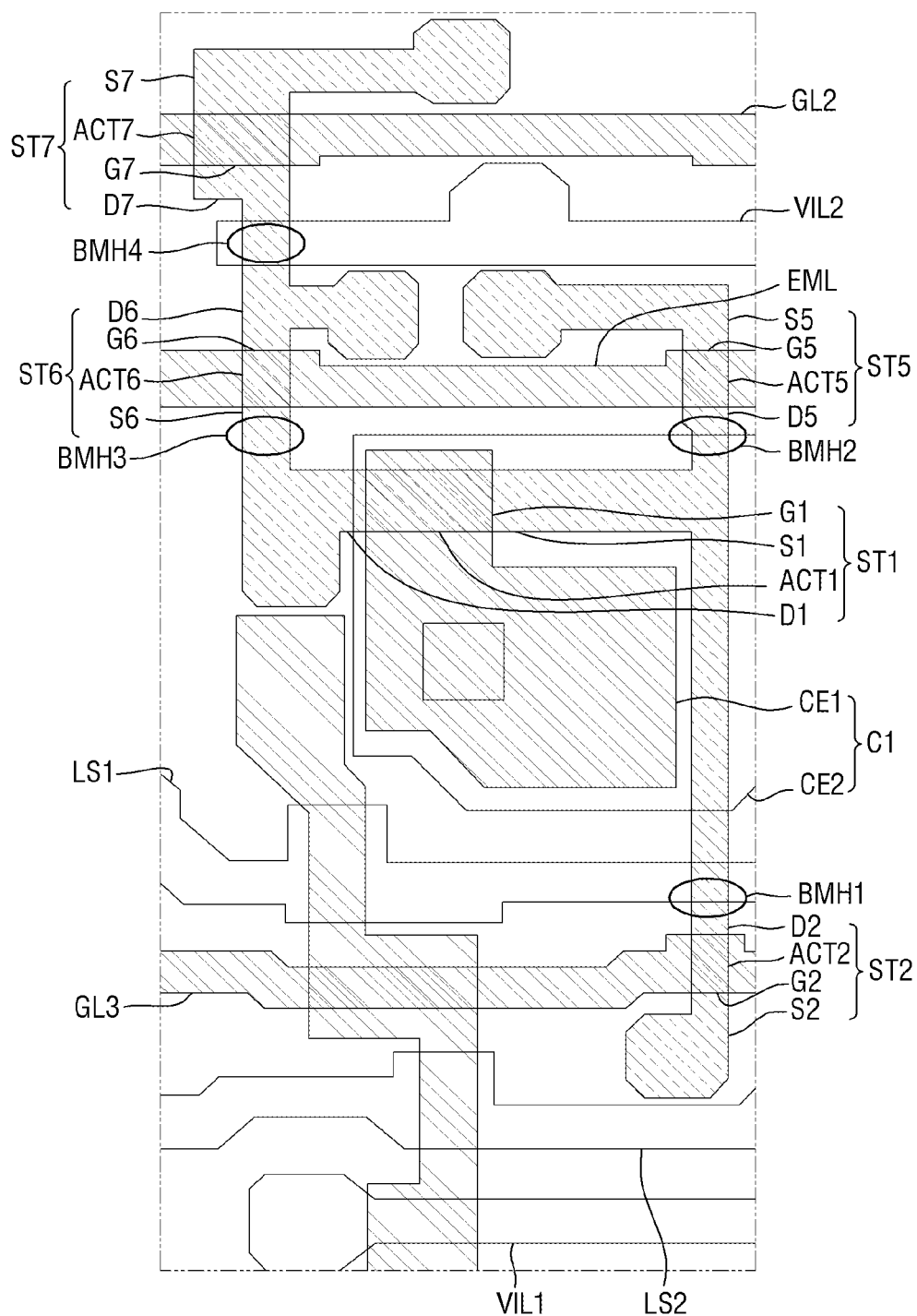
FIG. 9 is a plan view illustrating some layers of the first sub-pixel illustrated in FIG. 8.
Figure 10:
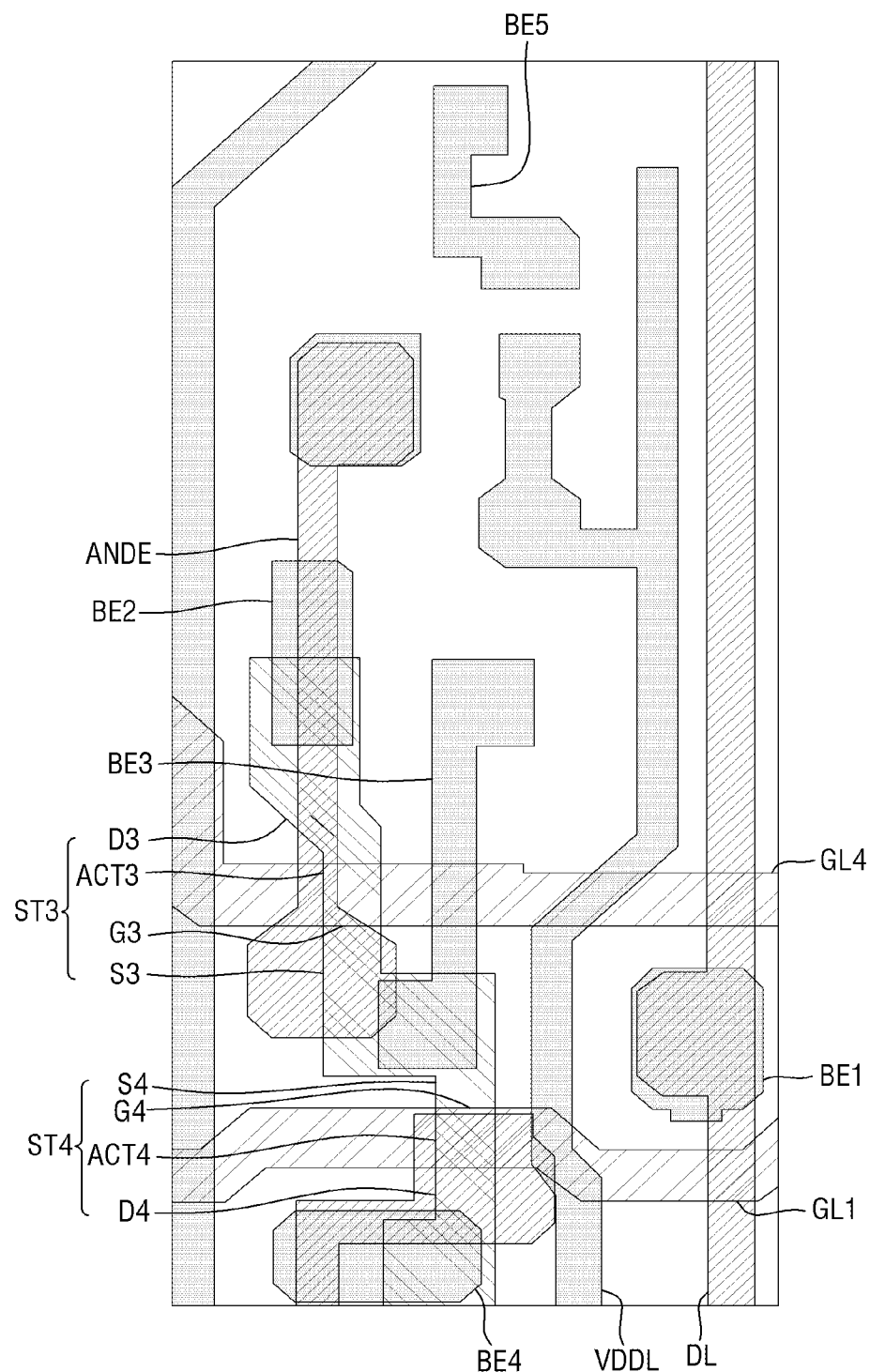
FIG. 10 is a plan view illustrating some other layers of the first sub-pixel illustrated in FIG. 8.

FIG. 8 is a plan view illustrating a first sub-pixel of a pixel portion in a display device according to an embodiment. FIG. 9 is a plan view illustrating some layers of the first sub-pixel illustrated in FIG. 8. FIG. 10 is a plan view illustrating some other layers of the first sub-pixel illustrated in FIG. 8. FIG. 8 may correspond to a diagram showing a structure in which a metal layer, a first active layer, a first gate layer, a second gate layer, a second active layer, a third gate layer, a first source-drain layer, and a second source-drain layer are sequentially stacked one on another. FIG. 9 may correspond to a diagram showing a structure in which the metal layer, the first active layer, the first gate layer and the second gate layer are sequentially stacked one on another, and FIG. 10 may correspond to a diagram showing a structure in which the second active layer, the third gate layer, the first source-drain layer, and the second source-drain layer are sequentially stacked one on another. The stacking relationship of the layers of FIGS. 8 to 10 will be described later in greater detail with reference to FIG. 11.

Referring to FIGS. 8 to 10, in an embodiment, the pixel portion PXA may include first to third sub-pixel areas PRA, PGA, and PBA. The first sub-pixel may be disposed in the first sub-pixel area PRA. The first sub-pixel may include a light emitting element EL and a pixel circuit, and the pixel circuit may include first to seventh transistors ST1, ST2, ST3, ST4, ST5, ST6, and ST7 and a capacitor C1.

The first transistor ST1 may include an active area ACT1, a gate electrode G1, a first electrode S1, and a second electrode D1. The active area ACT1 of the first transistor ST1 may overlap the gate electrode G1 of the first transistor ST1. In one embodiment, for example, the active area ACT1 of the first transistor ST1 may include or be formed of LTPS.

The gate electrode G1 of the first transistor ST1 may be connected to a third connection electrode BE3 through a sixth contact hole CNT6, and the third connection electrode BE3 may be connected to a second electrode S3 of the third transistor ST3 and a second electrode S4 of the fourth transistor ST4 through a fifth contact hole CNT5. In addition, a region of the gate electrode G1 of the first transistor ST1 overlapping the second electrode CE2 of the capacitor C1 may correspond to, e.g., defined, the first electrode CE1 of the capacitor C1.

A first electrode S1 of the first transistor ST1 may be connected to a second electrode D2 of the second transistor ST2 and a second electrode D5 of the fifth transistor ST5.

A second electrode D1 of the first transistor ST1 may be connected to a first electrode D3 of the third transistor ST3 and a first electrode S6 of the sixth transistor ST6. The second electrode D1 of the first transistor ST1 may be connected to a second connection electrode BE2 through the third contact hole CNT3, and the second connection electrode BE2 may be connected to a first electrode D3 of the third transistor ST3 through a fourth contact hole CNT4.

The second transistor ST2 may include an active area ACT2, a gate electrode G2, the first electrode S2, and the second electrode D2. The active area ACT2 of the second transistor ST2 may overlap the gate electrode G2 of the second transistor ST2. In one embodiment, for example, the active area ACT2 of the second transistor ST2 may include or be made of LTPS. The gate electrode G2 of the second transistor ST2, which is a part of the third gate line GL3, may correspond to a region of the third gate line GL3 that overlaps the active area ACT2.

The first electrode S2 of the second transistor ST2 may be connected to a first connection electrode BE1 through a first contact hole CNT1, and the first connection electrode BE1 may be connected to the data line DL through a second contact hole CNT2.

The second electrode D2 of the second transistor ST2 may be connected to the first electrode S1 of the first transistor ST1 and the second electrode D5 of the fifth transistor ST5.

The third transistor ST3 may include an active area ACT3, a gate electrode G3, a first electrode D3, and a second electrode S3. The active area ACT3 of the third transistor ST3 may overlap the gate electrode G3 of the third transistor ST3. In one embodiment, for example, the active area ACT3 of the third transistor ST3 may include an oxide-based active area. The gate electrode G3 of the third transistor ST3, which is a part of the fourth gate line GL4, may correspond to a region of the fourth gate line GL4 overlapping the active area ACT3.

The first electrode D3 of the third transistor ST3 may be connected to the second connection electrode BE2 through the fourth contact hole CNT4, and the second connection electrode BE2 may be connected to the second electrode D1 of the first transistor ST1 and the first electrode S6 of the sixth transistor ST6 through the third contact hole CNT3.

The second electrode S3 of the third transistor ST3 may be connected to the second electrode S4 of the fourth transistor ST4. The second electrode S3 of the third transistor ST3 may be connected to the third connection electrode BE3 through the fifth contact hole CNT5, and the third connection electrode BE3 may be connected to the gate electrode G1 of the first transistor ST1 through the sixth contact hole CNT6. In addition, a region of the gate electrode G1 of the first transistor ST1 overlapping the second electrode CE2 of the capacitor C1 may correspond to the first electrode CE1 of the capacitor C1.

The fourth transistor ST4 may include an active area ACT4, a gate electrode G4, a first electrode D4, and a second electrode S4. The active area ACT4 of the fourth transistor ST4 may overlap the gate electrode G4 of the fourth transistor ST4. In one embodiment, for example, the active area ACT4 of the fourth transistor ST4 may include an oxide-based active area. The gate electrode G4 of the fourth transistor ST4, which is a part of the first gate line GL1, may correspond to a region of the first gate line GL1 overlapping the active area ACT4.

The first electrode D4 of the fourth transistor ST4 may be connected to a fourth connection electrode BE4 through an eighth contact hole CNT8, and the fourth connection electrode BE4 may be connected to the first initialization voltage line VIL1 through a seventh contact hole CNT7.

The second electrode S4 of the fourth transistor ST4 may be connected to the second electrode S3 of the third transistor ST3. The second electrode S4 of the fourth transistor ST4 may be connected to the third connection electrode BE3 through the fifth contact hole CNT5, and the third connection electrode BE3 may be connected to the gate electrode G1 of the first transistor ST1 through the sixth contact hole CNT6. In addition, a region of the gate electrode G1 of the first transistor ST1 overlapping the second electrode CE2 of the capacitor C1 may correspond to the first electrode CE1 of the capacitor C1.

The fifth transistor ST5 may include an active area ACT5, a gate electrode G5, a first electrode S5, and a second electrode D5. The active area ACT5 of the fifth transistor ST5 may overlap the gate electrode G5 of the fifth transistor ST5. In one embodiment, for example, the active area ACT5 of the fifth transistor ST5 may include or be formed LTPS. The gate electrode G5 of the fifth transistor ST5, which is a part of the emission control line EML, may correspond to a region of the emission control line EML overlapping the active area ACT5.

The first electrode S5 of the fifth transistor ST5 may be connected to the driving voltage line VDDL through a tenth contact hole CNT10.

The second electrode D5 of the fifth transistor ST5 may be connected to the first electrode S1 of the first transistor ST1 and the second electrode D2 of the second transistor ST2.

The sixth transistor ST6 may include an active area ACT6, a gate electrode G6, a first electrode S6, and a second electrode D6. The active area ACT6 of the sixth transistor ST6 may overlap the gate electrode G6 of the sixth transistor ST6. In one embodiment, for example, the active area ACT6 of the sixth transistor ST6 may include or be formed of LTPS. The gate electrode G6 of the sixth transistor ST6, which is a part of the emission control line EML, may correspond to a region of the emission control line EML overlapping the active area ACT6.

The first electrode S6 of the sixth transistor ST6 may be connected to the second electrode D1 of the first transistor ST1. The first electrode S6 of the sixth transistor ST6 may be connected to the second connection electrode BE2 through the third contact hole CNT3, and the second connection electrode BE2 may be connected to the first electrode D3 of the third transistor ST3 through the fourth contact hole CNT4.

The second electrode D6 of the sixth transistor ST6 may be connected to the second electrode D7 of the seventh transistor ST7. The second electrode D6 of the sixth transistor ST6 may be connected to a sixth connection electrode BE6 through an eleventh contact hole CNT11, and the sixth connection electrode BE6 may be connected to an anode connection electrode ANDE through a twelfth contact hole CNT12. The anode connection electrode ANDE may be directly or indirectly connected to the first electrode of the light emitting element EL.

The seventh transistor ST7 may include an active area ACT7, a gate electrode G7, a first electrode S7, and a second electrode D7. The active area ACT7 of the seventh transistor ST7 may overlap the gate electrode G7 of the seventh transistor ST7. In one embodiment, for example, the active area ACT7 of the seventh transistor ST7 may include or be formed of LTPS. The gate electrode G7 of the seventh transistor ST7, which is a part of the second gate line GL2, may correspond to a region of the second gate line GL2 overlapping the active area ACT7.

The first electrode S7 of the seventh transistor ST7 may be connected to a fifth connection electrode BE5 through a fourteenth contact hole CNT14, and the fifth connection electrode BE5 may be connected to the second initialization voltage line VIL2 through a thirteenth contact hole CNT13.

The second electrode D7 of the seventh transistor ST7 may be connected to the second electrode D6 of the sixth transistor ST6. The second electrode D7 of the seventh transistor ST7 may be connected to the sixth connection electrode BE6 through the eleventh contact hole CNT11, and the sixth connection electrode BE6 may be connected to the anode connection electrode ANDE through the twelfth contact hole CNT12. The anode connection electrode ANDE may be directly or indirectly connected to the first electrode of the light emitting element EL.

The capacitor C1 may include a first electrode CE1 and a second electrode CE2. The first electrode CE1 of the capacitor C1, which is a part of the gate electrode G1 of the first transistor ST1, may correspond to a region of the gate electrodes G1 of the first transistor ST1 overlapping the second electrode CE2 of the capacitor C1. The second electrode CE2 of the capacitor C1 may be connected to the driving voltage line VDDL through a ninth contact hole CNT9.

In an embodiment, at least one hole BMH is defined through the metal layer BML. The at least one hole BMH may overlap at least a part of the first active layer disposed in the pixel portion PXA in the thickness direction. The metal layer BML may include first to fourth holes BMH1, BMH2, BMH3, and BMH4. The first to fourth holes BMH1, BMH2, BMH3, and BMH4 may be spaced apart from each other.

The first hole BMH1 may overlap a portion between the active area ACT1 of the first transistor ST1 and the active area ACT2 of the second transistor ST2. In one embodiment, for example, the first hole BMH1 may overlap the second electrode D2 of the second transistor ST2 connected to the first node N1. In an inversion repair process, light (e.g., laser) of a specific wavelength may pass through the first hole BMH1 to remove a part of the first active layer, so that connection between the first transistor ST1 and the second transistor ST2 may be blocked.

The second hole BMH2 may overlap a portion between the active area ACT1 of the first transistor ST1 and the active area ACT5 of the fifth transistor ST5. In one embodiment, for example, the second hole BMH2 may overlap the second electrode D5 of the fifth transistor ST5 connected to the first node N1. In the inversion repair process, light (e.g., laser) of a specific wavelength may pass through the second hole BMH2 to remove a part of the first active layer, so that connection between the first transistor ST1 and the fifth transistor ST5 may be blocked.

The third hole BMH3 may overlap a portion between the active area ACT1 of the first transistor ST1 and the active area ACT6 of the sixth transistor ST6. In one embodiment, for example, the third hole BMH3 may overlap the first electrode S6 of the sixth transistor ST6 connected to the second node N2. In the inversion repair process, light (e.g., laser) of a specific wavelength may pass through the third hole BMH3 to remove a part of the first active layer, so that connection between the first transistor ST1 and the sixth transistor ST6 may be blocked.

The fourth hole BMH4 may overlap a portion between the active area ACT6 of the sixth transistor ST6 and the active area ACT7 of the seventh transistor ST7. In one embodiment, for example, the fourth hole BMH4 may overlap the second electrode D7 of the seventh transistor ST7 connected to the fourth node N4. In the inversion repair process, light (e.g., laser light) of a specific wavelength may pass through the fourth hole BMH4 to remove a part of the first active layer, so that connection between the sixth transistor ST6 and the seventh transistor ST7 may be blocked.

In an embodiment of a method of manufacturing the display device 10, after forming the second pixels SP2 of the pixel portion PXA, a defective pixel among the second pixels SP2 of the display device 10 may be detected. When a defective pixel of the pixel portion PXA is detected, the active wiring of the defective pixel or the wiring of the pixel circuit of the defective pixel may be opened (i.e. disconnected or inactivated) through the inversion repair process, in which a laser of a specific wavelength is emitted thereto through the first to fourth holes BMH1 to BMH4. In the inversion repair process, light (e.g., laser light) of a specific wavelength may be irradiated from the bottom of the base member toward a part of the first active layer, and light of a specific wavelength may pass through at least one hole BMH of the metal layer BML to reach a part of the first active layer. In such an embodiment, the metal layer BML may prevent light of a specific wavelength from reaching an undesired point. Accordingly, since the metal layer BML that blocks light includes at least one hole BMH, when a defective pixel occurs, the active wiring of the defective pixel or the wiring of the pixel circuit of the defective pixel may be opened through the inversion repair process, thereby preventing lighting of the defective pixel, in which a laser of a specific wavelength is emitted thereto through the hole. The display device 10 may have improved reliability and improved image quality.

Figure 11:
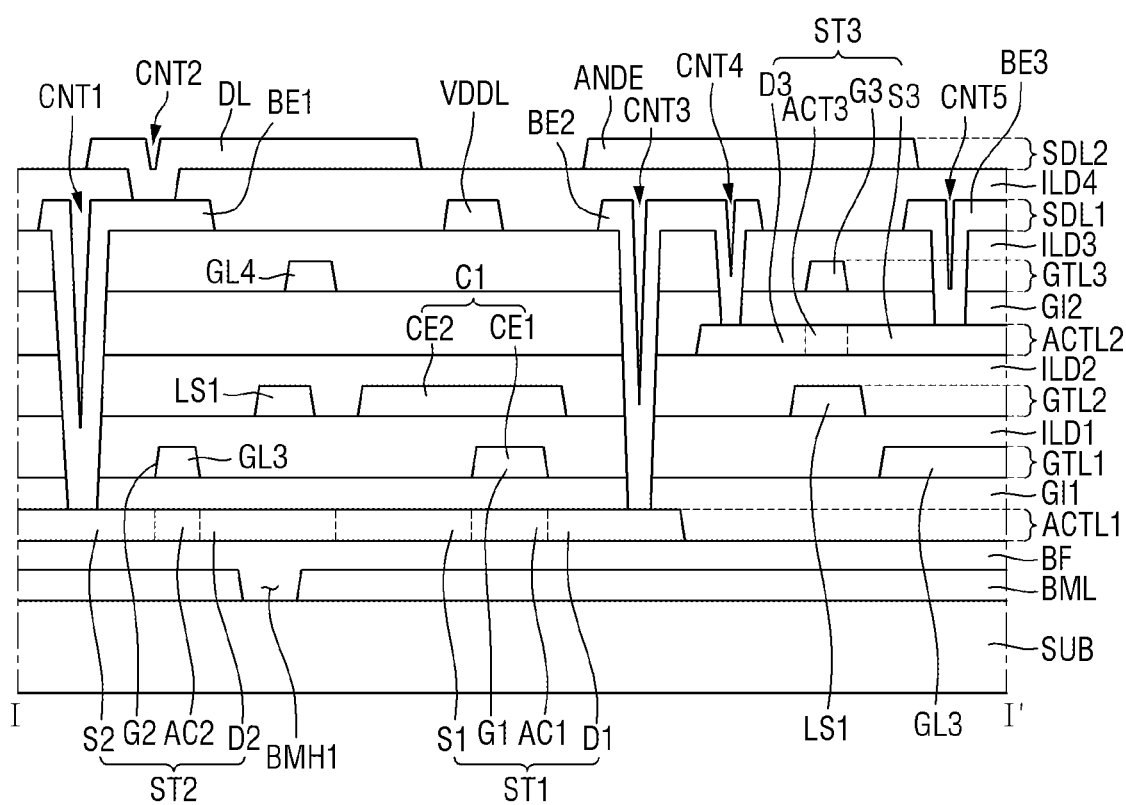
FIG. 11 is a cross-sectional view taken along line I-I' of FIG. 8.

FIG. 11 is a cross-sectional view taken along line I-I' of FIG. 8.

Referring to FIG. 11 in conjunction with FIGS. 8 to 10, an embodiment of the display panel 300 may include a substrate SUB, a metal layer BML, a buffer layer BF, a first active layer ACTL1, a first gate insulating layer GI1, a first gate layer GTL1, a first interlayer insulating layer ILD1, a second gate layer GTL2, a second interlayer insulating layer ILD2, a second active layer ACT2, a second gate insulating layer GI2, a third gate layer GTL3, a third interlayer insulating layer ILD3, a first source-drain layer SDL1, a fourth interlayer insulating layer ILD4, and a second source-drain layer SDL2.

The substrate SUB may be a base substrate or a base member, and may include or be made of an insulating material such as a polymer resin. In one embodiment, for example, the substrate SUB may be a flexible substrate which may be bent, folded and rolled.

The metal layer BML may be disposed on the substrate SUB to define the pixel portion PXA and the transmission portion TA of the second display area SDA. The metal layer BML may overlap at least a part of the first active layer ACTL1 disposed in the pixel portion PXA in the thickness direction. The metal layer BML may overlap the pixel portion PXA of the second display area SDA, thereby preventing light passing through the pixel portion PXA from reaching the sensor devices 740, 750, 760, and 770. The metal layer BML is disposed not to overlap the transmission portion TA of the second display area SDA, so that the transmission portion TA may allow light incident on the display panel 300 to pass therethrough almost as it is. Accordingly, even though the sensor devices 740, 750, 760, and 770 are disposed below the display panel 300, they can detect light incident from above the display panel 300.

In an embodiment, a first hole BMH1 is defined through the metal layer BML. The first hole BMH1 may overlap a portion between the active area ACT1 of the first transistor ST1 and the active area ACT2 of the second transistor ST2. In one embodiment, for example, the first hole BMH1 may overlap the second electrode D2 of the second transistor ST2 connected to the first node N1. In an inversion repair process, light (e.g., laser light) of a specific wavelength may pass through the first hole BMH1 to remove a part of the first active layer ACTL1, so that connection between the first transistor ST1 and the second transistor ST2 may be blocked.

The buffer layer BF may be disposed on the substrate SUB to cover the metal layer BML. In one embodiment, for example, the buffer layer BF may include a plurality of inorganic layers, and may be formed on the entire top surface of the substrate SUB to prevent moisture from penetrating the light emitting element EL through the substrate SUB.

The first active layer ACTL1 may be disposed on the buffer layer BF. The first active layer ACTL1 may include or be made of a silicon-based material. In one embodiment, for example, the first active layer ACTL1 may include or be formed of LTPS. Each of the respective active areas ACT1, ACT2, ACT5, ACT6, and ACTT, the first electrodes S1, S2, S5, S6, and S7, and the second electrodes D1, D2, D5, D6, and D7 of the first transistor ST1, the second transistor ST2, the fifth transistor ST5, the sixth transistor ST6, and the seventh transistor ST7 may be defined by a part of the first active layer ACTL1.

The first gate insulating layer GI1 may cover the buffer layer BF and the first active layer ACTL1, and insulate the first active layer ACTL1 from the first gate layer GTL1.

The first gate layer GTL1 may be disposed on the first gate insulating layer GI1. Each of the gate electrode G1 of the first transistor ST1, the second gate line GL2, the third gate line GL3, and the emission control line EML may be defined by a part of the first gate layer GTL1.

A part of the gate electrode G1 of the first transistor ST1 may overlap the second electrode CE2 of the capacitor C1 to form the first electrode CE1 of the capacitor C1.

A part of the second gate line GL2 may overlap the active area ACTT of the seventh transistor ST7 to form (e.g., define or function as) the gate electrode G7 of the seventh transistor ST7.

A part of the third gate line GL3 may overlap the active area ACT2 of the second transistor ST2 to form the gate electrode G2 of the second transistor ST2.

A part of the emission control line EML may overlap the active area ACT5 of the fifth transistor ST5 to form the gate electrode G5 of the fifth transistor ST5. Another part of the emission control line EML may overlap the active area ACT6 of the sixth transistor ST6 to form the gate electrode G6 of the sixth transistor ST6.

The first interlayer insulating layer ILD1 may cover the first gate layer GTL1 and the first gate insulating layer GI1. The first interlayer insulating layer ILD1 may insulate the first gate layer GTL1 from the second gate layer GTL2.

The second gate layer GTL2 may be disposed on the first interlayer insulating layer ILD1. Each of the first light blocking layer LS1, the second light blocking layer LS2, the second electrode CE2 of the capacitor C1, the first initialization voltage line VIL1, and the second initialization voltage line VIL2 may be defined by a part of the second gate layer GTL2.

The first light blocking layer LS1 may overlap the third transistor ST3 to block light incident on the third transistor ST3. The second light blocking layer LS2 may overlap the fourth transistor ST4 and block light incident on the fourth transistor ST4.

The second electrode CE2 of the capacitor C1 may be connected to the driving voltage line VDDL through a ninth contact hole CNT9. Accordingly, the capacitor C1 may maintain a potential difference between the driving voltage line VDDL and the gate electrode G1 of the first transistor ST1.

The second interlayer insulating layer ILD2 may cover the second gate layer GTL2 and the first interlayer insulating layer ILD1. The second interlayer insulating layer ILD2 may insulate the second gate layer GTL2 from the second active layer ACTL2.

The second active layer ACTL2 may be disposed on the second interlayer insulating layer ILD2. In one embodiment, for example, the second active layer ACTL2 may include or be made of an oxide-based material. Each of the active areas ACT3 and ACT4, the first electrodes D3 and D4, and the second electrodes S3 and S4 of the third and fourth transistors ST3 and ST4 may be defined by a part of the second active layer ACTL2.

The second gate insulating layer GI2 may cover the second interlayer insulating layer ILD2 and the second active layer ACTL2, and insulate the second active layer ACTL2 from the third gate layer GTL3.

The third gate layer GTL3 may be disposed on the second gate insulating layer GI2. Each of the first gate line GL1 and the fourth gate line GL4 may be defined by a part of the third gate layer GTL3.

A part of the first gate line GL1 may overlap the active area ACT4 of the fourth transistor ST4 to form the gate electrode G4 of the fourth transistor ST4.

A part of the fourth gate line GL4 may overlap the active area ACT3 of the third transistor ST3 to form the gate electrode G3 of the third transistor ST3.

The third interlayer insulating layer ILD3 may cover the third gate layer GTL3 and the second gate insulating layer GI2. The third interlayer insulating layer ILD3 may insulate the third gate layer GTL3 from the first source-drain layer SDL1.

The first source-drain layer SDL1 may be disposed on the third interlayer insulating layer ILD3. Each of the driving voltage line VDDL and the first to sixth connection electrodes BE1, BE2, BE3, BE4, BE5, and BE6 may be defined by a part of the first source-drain layer SDL1.

The first connection electrode BE1 may be connected to the first electrode S2 of the second transistor ST2 through the first contact hole CNT1, and may be connected to the data line DL through the second contact hole CNT2.

The second connection electrode BE2 may be connected to the second electrode D1 of the first transistor ST1 and the first electrode S6 of the sixth transistor ST6 through the third contact hole CNT3, and may be connected to the first electrode D3 of the third transistor ST3 through the fourth contact hole CNT4.

The third connection electrode BE3 may be connected to the second electrode S3 of the third transistor ST3 through the fifth contact hole CNT5, and may be connected to the gate electrode G1 of the first transistor ST1 through the sixth contact hole CNT6.

The fourth connection electrode BE4 may be connected to the first initialization voltage line VIL1 through the seventh contact hole CNT7, and may be connected to the first electrode D4 of the fourth transistor ST4 through the eighth contact hole CNT8.

The fifth connection electrode BE5 may be connected to the second initialization voltage line VIL2 through the thirteenth contact hole CNT13, and may be connected to the first electrode S7 of the seventh transistor ST7 through the fourteenth contact hole CNT14.

The sixth connection electrode BE6 may be connected to the second electrode D6 of the sixth transistor ST6 and the second electrode D7 of the seventh transistor ST7 through the eleventh contact hole CNT11, and may be connected to the anode connection electrode ANDE through the twelfth contact hole CNT12.

The fourth interlayer insulating layer ILD4 may cover the first source-drain layer SDL1 and the third interlayer insulating layer ILD3. The fourth interlayer insulating layer ILD4 may insulate the first source-drain layer SDL1 from the second source-drain layer SDL2.

The second source-drain layer SDL2 may be disposed on the fourth interlayer insulating layer ILD4. Each of the data line DL and the anode connection electrode ANDE may be defined by a part of the second source-drain layer SDL2.

Figure 12:
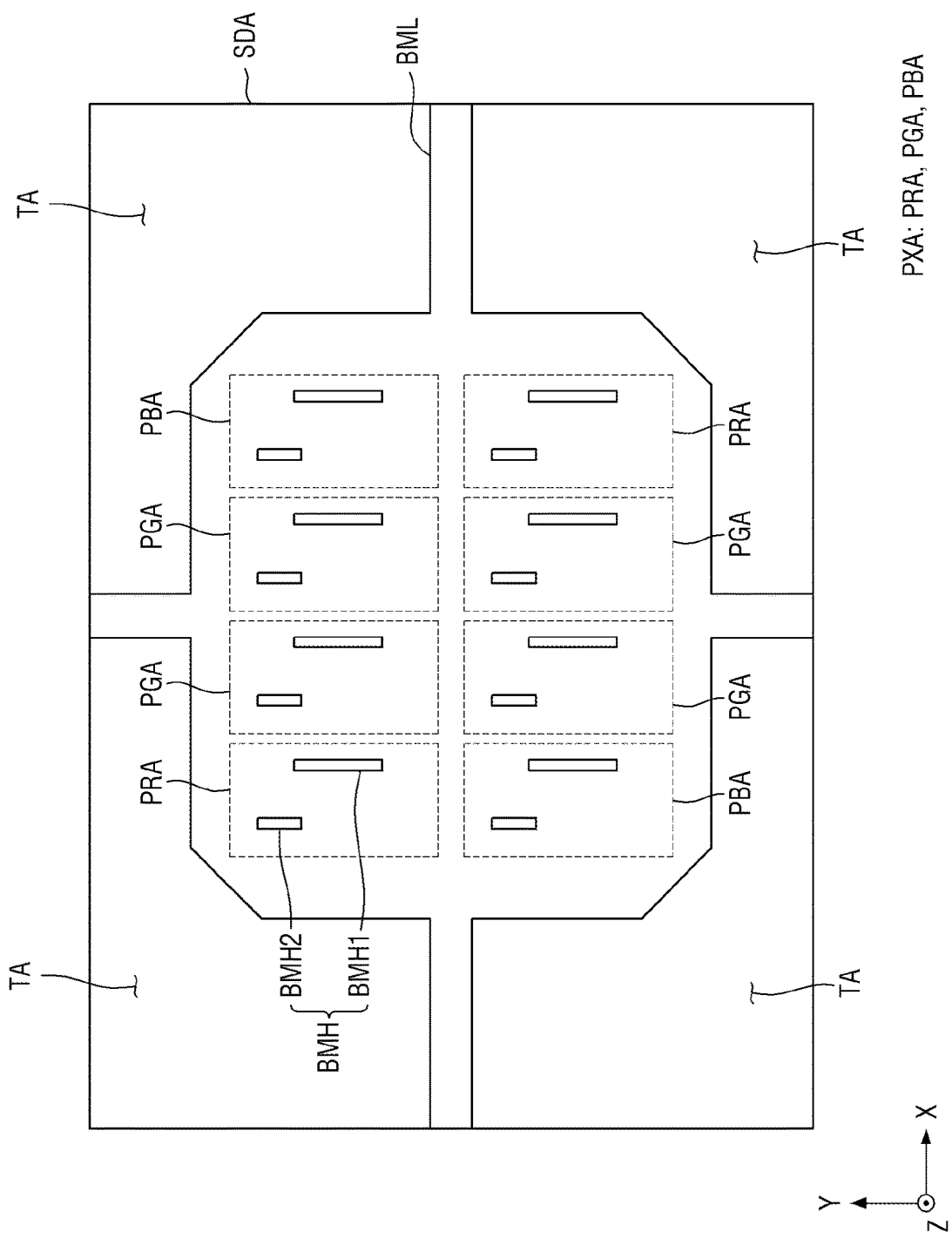
FIG. 12 is a plan view illustrating a metal layer of a display device according to an alternative embodiment.
Figure 13:
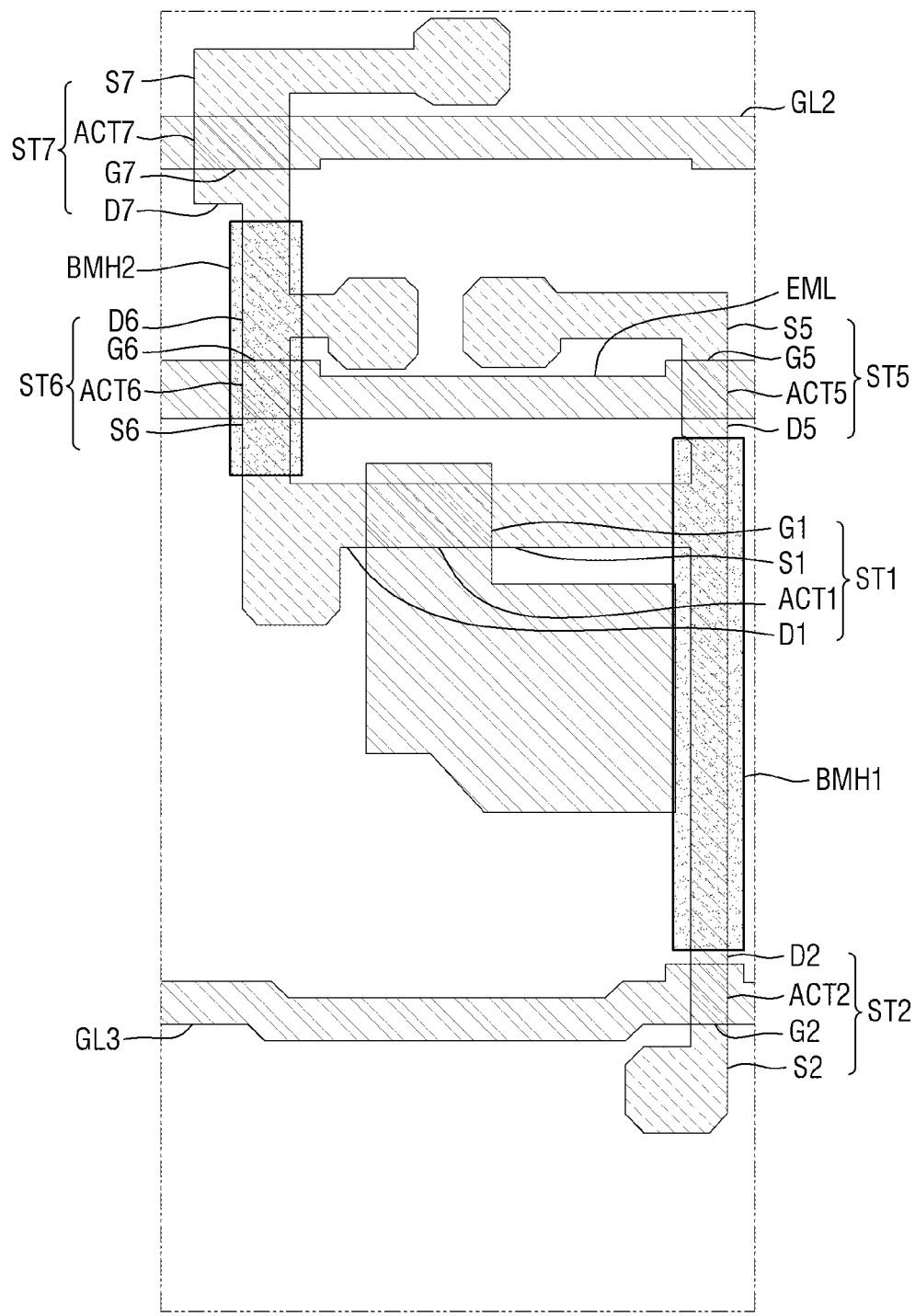
FIG. 13 is a plan view illustrating some layers of a first sub-pixel in a display device according to an alternative embodiment.

FIG. 12 is a plan view illustrating a metal layer of a display device according to an alternative embodiment. FIG. 13 is a plan view illustrating some layers of a first sub-pixel in a display device according to an alternative embodiment. The display device of FIGS. 12 and 13 is substantially the same as the display device of FIGS. 7 to 10 except for the configuration of the metal layer BML. The same or like elements shown in FIGS. 12 and 13 have been labeled with the same reference characters as used above to describe the embodiment of the display device shown in FIGS. 7 to 10, and any repetitive detailed description thereof will hereinafter be omitted or simplified.

Referring to FIGS. 12 and 13, in an embodiment of the display device, the metal layer BML may be disposed on the substrate SUB to define the pixel portion PXA and the transmission portion TA of the second display area SDA. The metal layer BML may overlap the pixel portion PXA of the second display area SDA, thereby preventing light passing through the pixel portion PXA from reaching the sensor devices 740, 750, 760, and 770. The metal layer BML is disposed not to overlap the transmission portion TA of the second display area SDA, so that the transmission portion TA may allow light incident on the display panel 300 to pass therethrough almost as it is. Accordingly, even though the sensor devices 740, 750, 760, and 770 are disposed below the display panel 300, the sensor devices 740, 750, 760, and 770 may detect light incident from above the display panel 300.

In such an embodiment, at least one hole BMH is defined through the metal layer BML. The at least one hole BMH may overlap at least a part of the first active layer ACTL1 disposed in the pixel portion PXA in the thickness direction. The metal layer BML may include first and second holes BMH1 and BMH2. The first and second holes BMH1 and BMH2 may be spaced apart from each other in the first direction (X-axis direction) and may extend in the second direction (Y-axis direction).

The first hole BMH1 may overlap a portion between the active area ACT2 of the second transistor ST2 and the active area ACT5 of the fifth transistor ST5. In one embodiment, for example, the first hole BMH1 may overlap each of the second electrode D2 of the second transistor ST2 connected to the first node N1 and the second electrode D5 of the fifth transistor ST5. In the inversion repair process, light (e.g., laser light) of a specific wavelength may pass through the first hole BMH1 to remove a part of the first active layer ACTL1, so that connection between the second transistor ST2 and the fifth transistor ST5 can be blocked. In addition, in the inversion repair process, connection between the first transistor ST1 and the second transistor ST2 and connection between the first transistor ST1 and the fifth transistor ST5 may be blocked through the first hole BMH1.

The second hole BMH2 may overlap a portion between the active area ACT1 of the first transistor ST1 and the active area ACTT of the seventh transistor ST7. In one embodiment, for example, the second hole BMH2 may overlap the active area ACT6 of the sixth transistor ST6. The second hole BMH2 may overlap the first electrode S6 of the sixth transistor ST6 connected to the second node N2, and may overlap the second electrode D7 of the seventh transistor ST7 connected to the fourth node N4. In the inversion repair process, light (e.g., laser light) of a specific wavelength may pass through the second hole BMH2 to remove a part of the first active layer ACTL1, so that connection between the sixth transistor ST6 and the seventh transistor ST7 may be blocked. In addition, in the inversion repair process, connection between the first transistor ST1 and the sixth transistor ST6 and connection between the first transistor ST1 and the seventh transistor ST7 may be blocked through the second hole BMH2.

Accordingly, since the metal layer BML that blocks light includes at least one hole BMH, when a defective pixel occurs, the defective pixel or the wiring of the pixel circuit of the defective pixel may be opened through the inversion repair process, in which a laser of a specific wavelength is emitted thereto through the first and second holes BMH1 and BMH2, thereby preventing lighting of the defective pixel. The display device 10 may have improved reliability and improved image quality.

Figure 14:
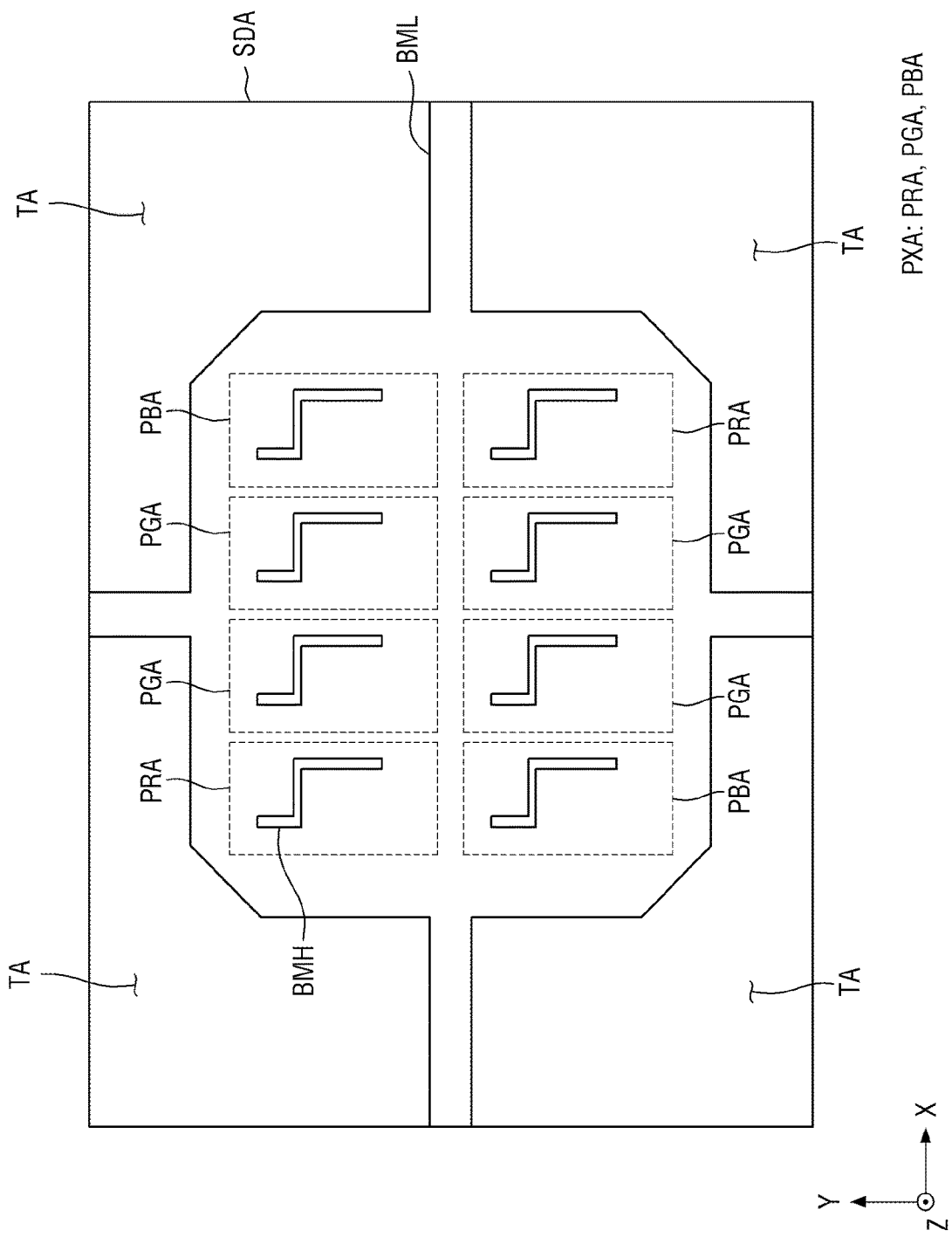
FIG. 14 is a plan view illustrating a metal layer of a display device according to another alternative embodiment.
Figure 15:
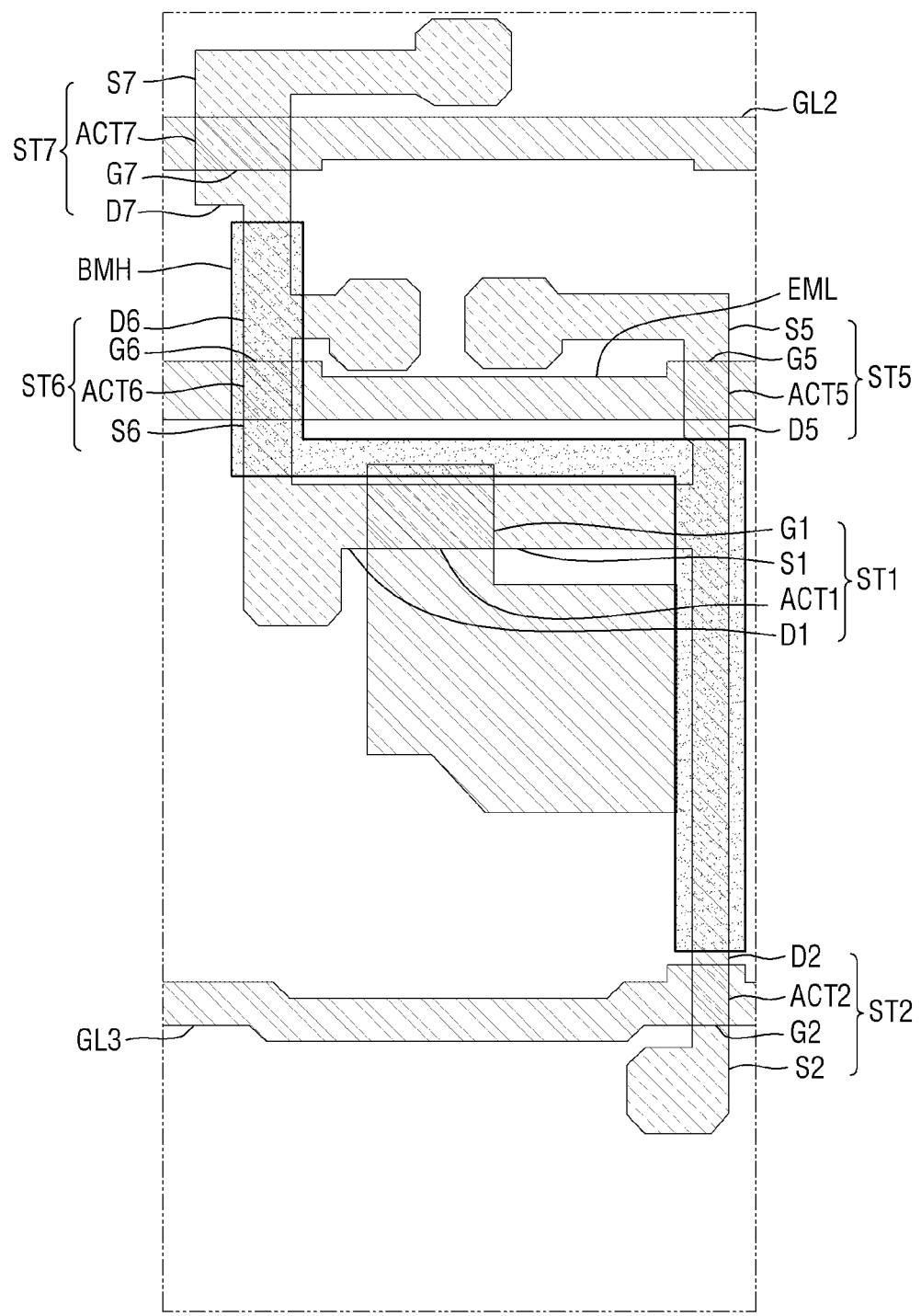
FIG. 15 is a plan view illustrating some layers of a first sub-pixel in a display device according to another alternative embodiment.

FIG. 14 is a plan view illustrating a metal layer of a display device according to another alternative embodiment. FIG. 15 is a plan view illustrating some layers of a first sub-pixel in a display device according to another alternative embodiment. The display device of FIGS. 14 and 15 is substantially the same as the display device of FIGS. 12 and 13 except for the configuration of the metal layer BML. The same or like elements shown in FIGS. 12 and 13 have been labeled with the same reference characters as used above to describe the embodiment of the display device shown in FIGS. 12 and 10, and any repetitive detailed description thereof will hereinafter be omitted or simplified.

Referring to FIGS. 14 and 15, the metal layer BML may be disposed on the substrate SUB to define the pixel portion PXA and the transmission portion TA of the second display area SDA. The metal layer BML may overlap the pixel portion PXA of the second display area SDA, thereby preventing light passing through the pixel portion PXA from reaching the sensor devices 740, 750, 760, and 770. The metal layer BML is disposed not to overlap the transmission portion TA of the second display area SDA, so that the transmission portion TA may allow light incident on the display panel 300 to pass therethrough almost as it is. Accordingly, even though the sensor devices 740, 750, 760, and 770 are disposed below the display panel 300, the sensor devices 740, 750, 760, and 770 may detect light incident from above the display panel 300.

In an embodiment, a hole BMH is defined through the metal layer BML. The hole BMH may overlap at least a part of the first active layer ACTL1 disposed in the pixel portion PXA in the thickness direction.

The hole BMH may overlap a portion between the active area ACT2 of the second transistor ST2 and the active area ACT7 of the seventh transistor ST7. The hole BMH may be bent at least once along the first active layer ACTL1. In one embodiment, for example, a part of the metal layer BML overlapping the second electrode D2 of the second transistor ST2 may extend in the second direction (Y-axis direction), and may be bent in a direction opposite to the first direction (X-axis direction) at a point overlapping the second electrode D5 of the fifth transistor ST5. A part of the bent metal layer BML may extend in the direction opposite to the first direction (X-axis direction), and may be bent in the second direction (Y-axis direction) at a point overlapping the first electrode S6 of the sixth transistor ST6. Another part of the bent metal layer BML may extend until it overlaps the second electrode D7 of the seventh transistor ST7.

In the inversion repair process, light (e.g., laser light) of a specific wavelength may pass through the hole BMH to remove a part of the first active layer ACTL1, so that connection between the second transistor ST2 and the seventh transistor ST7 can be blocked. In addition, in the inversion repair process, connection between the first transistor ST1 and the second transistor ST2, connection between the first transistor ST1 and the fifth transistor ST5, and connection between the first transistor ST1 and the sixth transistor ST6 may be blocked through the hole BMH.

Accordingly, since the metal layer BML that blocks light includes the hole BMH, when a defective pixel occurs, the active wiring of the defective pixel or the wiring of the pixel circuit of the defective pixel may be opened through the inversion repair process, in which a laser of a specific wavelength is emitted thereto through the hole BMH, thereby preventing lighting of the defective pixel. The display device 10 may have improved reliability and improved image quality.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel including a first display area including first pixels, and a second display area including a pixel portion, in which second pixels are disposed, and a transmission portion, through which light is transmitted,
wherein the pixel portion of the second display area comprises:
a base member;
a metal layer disposed on the base member to define the transmission portion;
a first active layer disposed on the metal layer, wherein the first active layer comprises a first material; and
a first gate layer disposed on the first active layer, and
wherein a hole is defined through the metal layer to overlap at least a part of the first active layer in a thickness direction of the display panel,
wherein the metal layer overlaps the other part of the first active layer.

2. The display device of claim 1, wherein each of the second pixels comprises:
a light emitting element;
a first transistor which controls a driving current supplied to the light emitting element; and
a second transistor which selectively supplies a data voltage to a first node, which is a first electrode of the first transistor,
wherein the hole includes a first hole overlapping a portion between an active area of the first transistor and an active area of the second transistor.

3. The display device of claim 2, wherein the first hole overlaps a second electrode of the second transistor connected to the first node.

4. The display device of claim 2, wherein each of the second pixels further comprises:
a third transistor which selectively connects a second node, which is a second electrode of the first transistor, to a third node, which is a gate electrode of the first transistor;
a fourth transistor which selectively supplies a first initialization voltage to the third node; and
a fifth transistor configured to selectively supply a driving voltage to the first node,
wherein the hole includes a second hole overlapping a portion between the active area of the first transistor and an active area of the fifth transistor.

5. The display device of claim 4, wherein the second hole overlaps a second electrode of the fifth transistor connected to the first node.

6. The display device of claim 4, wherein each of the second pixels further comprises:
a sixth transistor which selectively connects the second node to a fourth node, which is a first electrode of the light emitting element,
wherein the hole further includes a third hole overlapping a portion between the active area of the first transistor and an active area of the sixth transistor.

7. The display device of claim 6, wherein the third hole overlaps a first electrode of the sixth transistor connected to the second node.

8. The display device of claim 6, wherein each of the second pixels further comprises:

a seventh transistor which selectively supplies a second initialization voltage to the fourth node, wherein the hole further includes a fourth hole overlapping a portion between the active area of the sixth transistor and an active area of the seventh transistor.

9. The display device of claim 8, wherein the fourth hole overlaps a second electrode of the seventh transistor connected to the fourth node.

10. The display device of claim 8, wherein the active areas of each of the first transistor, the second transistor, the fifth transistor, the sixth transistor, and the seventh transistor is defined by a part of the first active layer.

11. The display device of claim 4, wherein the pixel portion of the second display area further comprises:
   a second gate layer disposed on the first gate layer;
   a second active layer disposed on the second gate layer, wherein the second active layer comprises a second material different from the first material; and
   a third gate layer disposed on the second active layer,
   wherein the active areas of each of the third transistor and the fourth transistor is defined by a part of the second active layer.

12. The display device of claim 1, wherein each of the second pixels comprises:
   a light emitting element;
   a first transistor which controls a driving current supplied to the light emitting element;
   a second transistor which selectively supplies a data voltage to a first node, which is a first electrode of the first transistor;
   a third transistor which selectively connects a second node, which is a second electrode of the first transistor, to a third node, which is a gate electrode of the first transistor;
   a fourth transistor which selectively supplies a first initialization voltage to the third node; and
   a fifth transistor which selectively supplies a driving voltage to the first node,
   wherein the hole includes a first hole overlapping a portion between an active area of the second transistor and an active area of the fifth transistor.

13. The display device of claim 12, wherein the first hole overlaps each of a second electrode of the second transistor and a second electrode of the fifth transistor connected to the first node.

14. The display device of claim 12, wherein each of the second pixels further comprises:
   a sixth transistor which selectively connects the second node to a fourth node, which is a first electrode of the light emitting element; and
   a seventh transistor which selectively supplies a second initialization voltage to the fourth node,
   wherein the hole further includes a second hole overlapping a portion between an active area of the first transistor and an active area of the seventh transistor.

15. The display device of claim 14, wherein the second hole overlaps an active area of the sixth transistor.

16. The display device of claim 14, wherein the second hole overlaps a first electrode of the sixth transistor connected to the second node, and overlaps a second electrode of the seventh transistor connected to the fourth node.

17. The display device of claim 14, wherein the first hole and the second hole are spaced apart from each other in a first direction, and extend in a second direction crossing the first direction.

18. The display device of claim 1, wherein each of the second pixels comprises:
   a light emitting element;
   a first transistor which controls a driving current supplied to the light emitting element;
   a second transistor which selectively supplies a data voltage to a first node, which is a first electrode of the first transistor;
   a third transistor which selectively connects a second node, which is a second electrode of the first transistor, to a third node, which is a gate electrode of the first transistor;
   a fourth transistor which selectively supplies a first initialization voltage to the third node;
   a fifth transistor which selectively supplies a driving voltage to the first node;
   a sixth transistor which selectively connects the second node to a fourth node, which is a first electrode of the light emitting element; and
   a seventh transistor which selectively supplies a second initialization voltage to the fourth node,
   wherein the hole overlaps a portion between an active area of the second transistor and an active area of the seventh transistor.

19. The display device of claim 18, wherein the hole is bent at least once along the first active layer.

20. The display device of claim 18, wherein the hole overlaps each of a second electrode of the second transistor connected to the first node, a second electrode of the fifth transistor connected to the first node, a first electrode of the sixth transistor connected to the second node, and a second electrode of the seventh transistor connected to the fourth node.

* * * * *